(12) United States Patent
Chanemougame et al.

(10) Patent No.: US 10,192,819 B1
(45) Date of Patent: Jan. 29, 2019

(54) INTEGRATED CIRCUIT STRUCTURE INCORPORATING STACKED FIELD EFFECT TRANSISTORS

(71) Applicant: GLOBALFOUNDRIES INC., Grand Cayman (KY)

(72) Inventors: Daniel Chanemougame, Niskayuna, NY (US); Lars Liebmann, Mechanicville, NY (US); Ruilong Xie, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/814,435

(22) Filed: Nov. 16, 2017

(51) Int. Cl.
| | |
|---|---|
| *H01L 29/00* | (2006.01) |
| *H01L 23/50* | (2006.01) |
| *H01L 25/07* | (2006.01) |
| *H01L 29/417* | (2006.01) |
| *H01L 21/8234* | (2006.01) |

(52) U.S. Cl.
CPC ............ *H01L 23/50* (2013.01); *H01L 25/074* (2013.01); *H01L 21/823475* (2013.01); *H01L 29/41791* (2013.01); *H01L 2924/14* (2013.01)

(58) Field of Classification Search
None
See application file for complete search history.

(56) References Cited

U.S. PATENT DOCUMENTS

| | | | |
|---|---|---|---|
| 8,274,119 B2 | 9/2012 | Xiao et al. | |
| 8,492,220 B2 | 7/2013 | Erickson et al. | |
| 9,431,388 B1 | 8/2016 | Gauthier, Jr. et al. | |
| 9,508,712 B2 * | 11/2016 | Wahl | H01L 27/088 |
| 9,685,564 B2 | 6/2017 | Sengupta et al. | |
| 9,837,414 B1 | 12/2017 | Balakrishnan et al. | |
| 2007/0007601 A1 | 1/2007 | Hsu et al. | |
| 2008/0173944 A1* | 7/2008 | Coronel | H01L 21/84 257/351 |
| 2009/0050941 A1 | 2/2009 | Yamazaki et al. | |
| 2009/0142888 A1 | 6/2009 | Tsuchiya | |

(Continued)

OTHER PUBLICATIONS

Guillaume Bouche, "F800 CFET Integration," IMEC Partner Technical Week Presentation, Apr. 25, 2017, Slide 14.

(Continued)

*Primary Examiner* — Kevin M Picardat
(74) *Attorney, Agent, or Firm* — Gibb & Riley, LLC; Anthony J. Canale

(57) ABSTRACT

Disclosed are integrated circuit (IC) structure embodiments that incorporate a stacked pair of field effect transistors (FETs) (e.g., gate-all-around FETs) and metal components that enable power and/or signal connections to source/drain regions of those FETs. Specifically, the IC includes a first FET and a second FET stacked on and sharing a gate with the first FET. The metal components include an embedded contact in a source/drain region of the first FET and connected to a wire (e.g., a power or signal wire). The wire can be a front end of the line (FEOL) wire positioned laterally adjacent to the source/drain region and the embedded contact can extend laterally from the source/drain region to the FEOL wire. Alternatively, the wire can be a back end of the line (BEOL) wire and an insulated contact can extend vertically from the embedded contact through the second FET to the BEOL wire.

20 Claims, 26 Drawing Sheets

(56) References Cited

U.S. PATENT DOCUMENTS

| | | |
|---|---|---|
| 2010/0295021 A1 | 11/2010 | Chang et al. |
| 2011/0254013 A1* | 10/2011 | Xiao ................ H01L 21/84 257/76 |
| 2013/0341704 A1* | 12/2013 | Rachmady ........ H01L 29/66545 257/327 |
| 2016/0043074 A1 | 2/2016 | Hurley et al. |
| 2016/0111513 A1 | 4/2016 | Liu et al. |
| 2017/0005106 A1 | 1/2017 | Zhang |
| 2017/0040321 A1 | 2/2017 | Mitard |
| 2017/0133279 A1 | 5/2017 | Peng |
| 2017/0162687 A1* | 6/2017 | Miyairi ............... H01L 29/785 |
| 2017/0243866 A1 | 8/2017 | Then et al. |
| 2018/0061766 A1 | 3/2018 | Goktepeli |
| 2018/0108577 A1* | 4/2018 | Zhu ............... H01L 21/823885 |

OTHER PUBLICATIONS

Diederik Verkest, "Y107," IMEC Partner Technical Week Presentation, Apr. 24, 2017, Slides 40-41.
U.S. Appl. No. 15/814,445, Notice of Allowance dated Jun. 27, 2018, pp. 1-9.

* cited by examiner

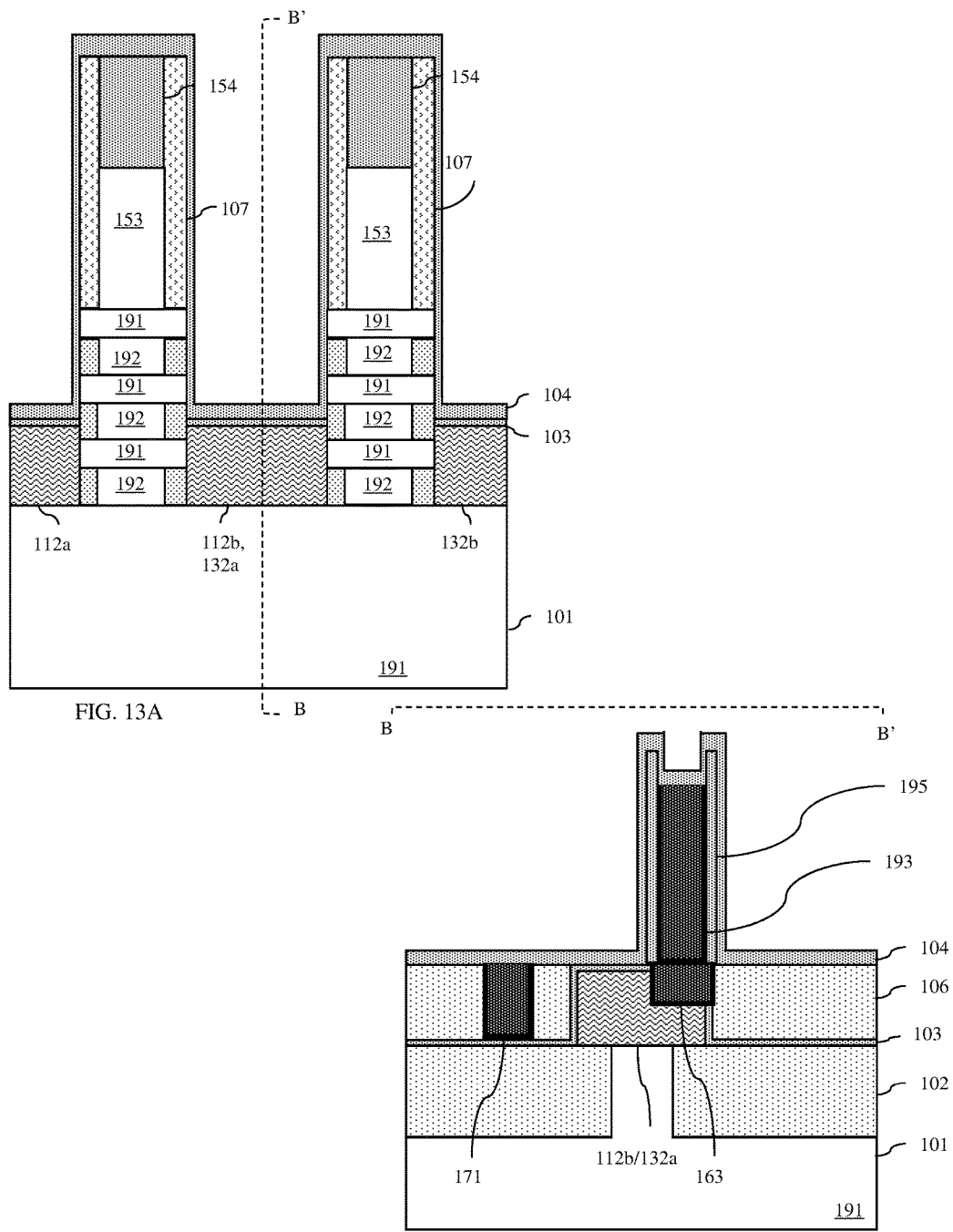

INTEGRATED CIRCUIT STRUCTURE INCORPORATING STACKED FIELD EFFECT TRANSISTORS

BACKGROUND

Field of the Invention

The present invention relates to integrated circuit (IC) structures and, more particularly, to embodiments of an IC structure that incorporates stacked field effect transistors (FETs), such as stacked gate-all-around field effect transistors (GAAFETs), and various metal components that enable power and/or signal connections to the source/drain regions of the FETs.

Description of Related Art

Integrated circuit (IC) design decisions are often driven by device scalability, device density, manufacturing efficiency and costs. For example, size scaling of planar field effect transistors (FETs) resulted in the development of planar FETs with relatively short channel lengths but, unfortunately, the smaller channel lengths resulted in a corresponding increase in short channel effects.

In response, fin-type FETs (FINFETs) were developed. A FINFET is a non-planar FET that incorporates a semiconductor fin (i.e., an elongated, relatively tall and thin, essentially rectangular-shaped, semiconductor body) and, within the semiconductor fin, a channel region positioned laterally between source/drain regions. A gate structure is positioned adjacent to the top surface and opposing sidewalls of the semiconductor fin at the channel region. Such a FINFET exhibits two-dimensional field effects as compared to the single-dimensional field effects exhibited by a planar FET and, thus, exhibits improved gate control over the channel region. It should be noted that, because the semiconductor fin is so thin, any field effects exhibited at the top surface are insignificant (i.e., negligible).

Recently, to improve drive current and electrostatics and to allow for further device size scaling, gate-all-around field effect transistors (GAAFETs) (e.g., nanowire-type GAAFETs or nanosheet-type GAAFETs) have been developed. A GAAFET includes elongated nanoshape(s) (e.g., nanowires or nanosheets), which extend laterally between source/drain regions, and a wrap-around gate structure, which wraps around the nanoshape(s) such that the nanoshape(s) function as channel region(s). Additionally, to allow for area scaling of integrated circuits that incorporate multiple GAAFETs, the GAAFETs can be stacked as opposed to positioned side by side.

Specifically, a conventional layout with multiple gate-all-around field effect transistors (GAAFETs) will typically have a row of N-type GAAFETs on one-side, a corresponding row of P-type GAAFETs on the opposite side, and shared gates that extend laterally across and wrap around the channel regions of side-by-side pairs of N-type and P-type GAAFETs. Contrarily, a layout with multiple stacked pairs of GAAFETs will have P-type GAAFETs on one-level, N-type GAAFETs on an adjacent level (i.e., above or below) and, shared gates, where each shared gate extends vertically across and wraps around the channel regions of a stacked pair of N-type and P-type GAAFETs. In this case, the source/drain regions of the lower GAAFET will be electrically isolated from the source/drain regions of the upper GAAFET by dielectric layers. Unfortunately, while stacked pairs of N-type and P-type GAAFETs consume less chip area than side-by-side pairs of N-type and P-type GAAFETs, providing the necessary power and/or signal connections to the source/drain regions of the lower GAAFETs can be complex and may limit the area savings.

SUMMARY

In view of the foregoing, disclosed herein are integrated circuit (IC) structure embodiments that incorporate one or more stacked pairs of field effect transistors (FETs) (e.g., stacked pairs of gate-all-around field effect transistors (GAAFETs)) and various metal components that enable power and/or signal connections to the source/drain regions of those GAAFETs.

Generally, each integrated circuit (IC) structure embodiment includes at least one stacked pair of field effect transistors (e.g., at least one stacked pair of gate-all-around field effect transistors (GAAFETs)) and, particularly, a first FET on a substrate and a second FET stacked above the first FET. The first FET can include two first source/drain regions and at least one first channel region positioned laterally between the two first source/drain regions. The second FET can include two second source/drain regions and at least one second channel region positioned laterally between the two second source/drain regions. The two second source/drain regions and the second channel region(s) can be aligned above the two first source/drain regions and the first channel region(s), respectively, and the two second source/drain regions can be electrically isolated from the two first source/drain regions by a dielectric layer. A shared gate can be adjacent to the channel regions of both the second FET and the first FET.

Each IC structure embodiment can further include an embedded contact in a first source/drain region of the first FET in order to enable a power and/or signal connection to that first source/drain region. That is, the embedded contact can be electrically connected to a wire (e.g., either a power wire or a signal wire). The wire can be a buried wire (also referred to herein as a front end of the line (FEOL) wire) that is positioned laterally adjacent to the first source/drain region and, in this case, the embedded contact can extend laterally beyond a side edge of the first source/drain region to the buried wire. Alternatively, the wire can be a metal level wire (also referred to herein as a back end of the line (BEOL) wire) positioned in a metal level above the second FET and, in this case, an insulated contact (i.e., a contact wrapped by a dielectric sidewall spacer) can extend vertically from the embedded contact in the first source/drain region through the second FET up to the metal level wire.

One specific embodiment of the integrated circuit (IC) structure disclosed herein can include at least one stacked pair of FETs, as described above. This embodiment can further include embedded contacts in different source/drain regions and connected to different buried wires, respectively. For example, a first buried wire can be adjacent to a first source/drain region of the first FET on a first side of the stacked pair. A first embedded contact can be in that first source/drain region and can further extend laterally beyond a side edge of the first source/drain region to the first buried wire. Additionally, a second buried wire can be adjacent to a second source/drain region of the second FET and on a second side of the stacked pair opposite the first side. A second embedded contact can be in that second source/drain region and can extend laterally beyond a side edge of the second source/drain region to the second buried wire. It should be noted that the second source/drain region, which has the second embedded contact connected to the second buried wire, could be aligned above and on the same side of the shared gate as the first source/drain region, which has the first embedded contact connected to the first buried wire. Alternatively, the second source/drain region, which has the second embedded contact connected to the second buried wire, could be on the opposite side of the shared gate as the first source/drain region, which has the first embedded contact connected to the first buried wire.

Another embodiment of the integrated circuit (IC) structure disclosed herein can similarly include at least one stacked pair of FETs, as described above. This embodiment can further include embedded contacts in both of the first source/drain regions of the first FET. These embedded contacts can be electrically connected to different wires and, particularly, to a buried wire and to a metal level wire, respectively. That is, this embodiment can further include a buried wire and a metal level wire. The buried wire can be positioned laterally adjacent to the first source/drain regions of the first FET on a first side of the stacked pair. The metal level wire can be above the second FET (i.e., in a BEOL metal level) and can be positioned on a second side of the stacked pair opposite the first side. A first embedded contact can be in one of the first source/drain regions of the first FET and can extend laterally beyond a side edge of that first source/drain region to the buried wire. A second embedded contact can be in the other one of the first source/drain regions and an insulated contact (i.e., a contact that is wrapped by a dielectric sidewall spacer) can extend vertically from the second embedded contact through the second FET to the metal level wire.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 13A-13B are cross-section diagrams of a partially completed IC structure formed according to the flow diagram of FIGS. 2A-2B;

DETAILED DESCRIPTION

Figure 1A:
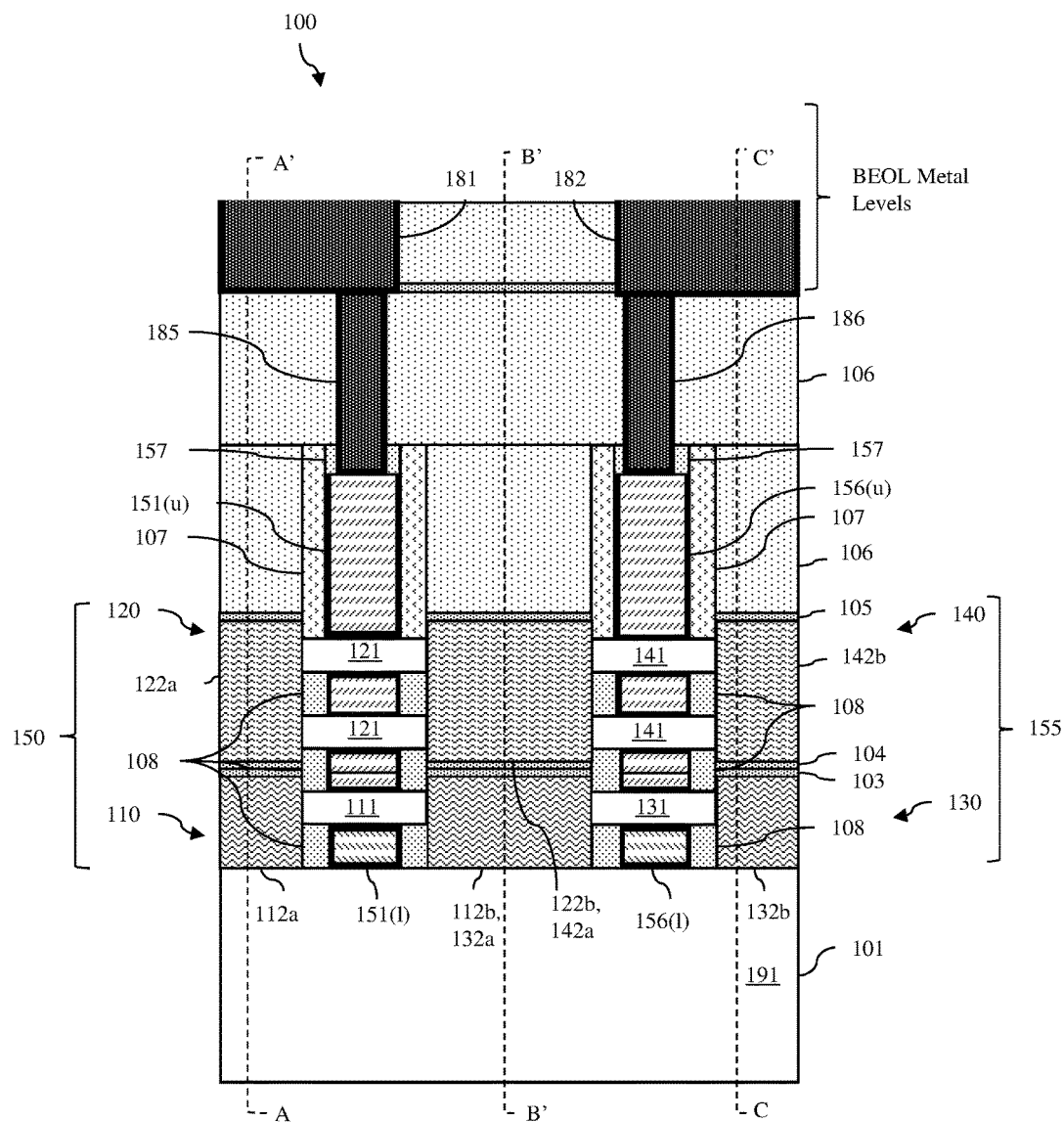
FIGS. 1A-1D and FIG. 1E are different cross-section diagrams and a layout diagram of an embodiment of an integrated circuit (IC) structure.
Figure 1B:
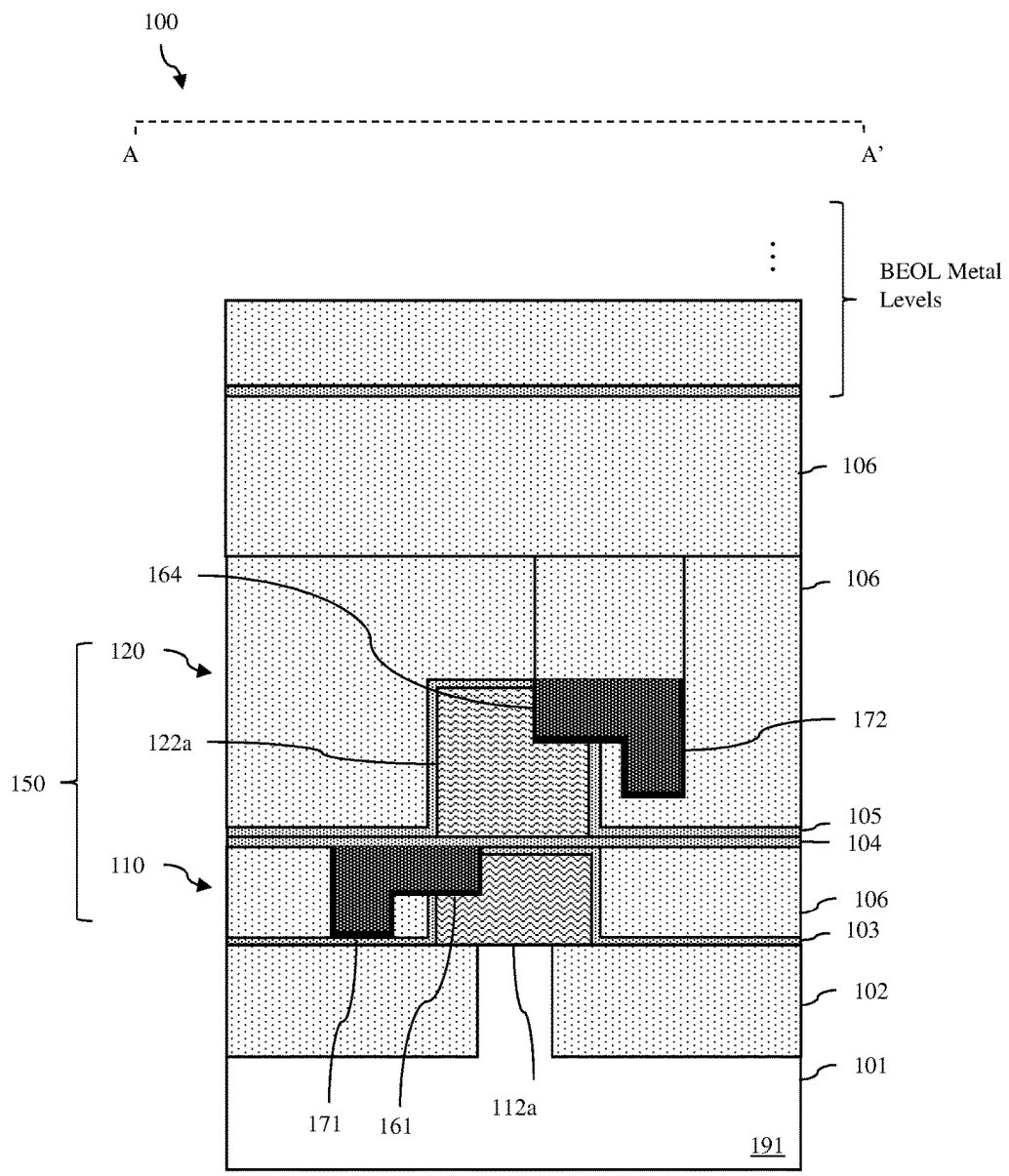

As mentioned above, a conventional layout with multiple gate-all-around field effect transistors (GAAFETs) will typically have a row of N-type GAAFETs on one-side, a corresponding row of P-type GAAFETs on the opposite side, and shared gates that extend laterally across and wrap around the channel regions of side-by-side pairs of N-type and P-type GAAFETs. Contrarily, a layout with multiple stacked pairs of GAAFETs will have P-type GAAFETs on one-level, N-type GAAFETs on an adjacent level (i.e., above or below) and, shared gates, where each shared gate extends vertically across and wraps around the channel regions of a stacked pair of N-type and P-type GAAFETs. In this case, the source/drain regions of the lower GAAFET will be electrically isolated from the source/drain regions of the upper GAAFET by dielectric layers. Unfortunately, while stacked pairs of N-type and P-type GAAFETs consume less chip area than side-by-side pairs of N-type and P-type GAAFETs, providing the necessary power and/or signal connections to the source/drain regions of the lower GAAFETs can be complex and may limit the area savings.

In view of the foregoing, disclosed herein are integrated circuit (IC) structure embodiments that incorporate one or more stacked pairs of field effect transistors (FETs) (e.g., one or more stacked pairs of gate-all-around field effect transistors (GAAFETs)) and various metal components that enable power and/or signal connections to the source/drain regions of the FETs and that facilitate size scaling of cells that incorporate the stacked pairs (e.g., by reducing the number of metal tracks required). Each stacked pair of FETs can include a first FET (i.e., a lower FET) and a second FET (i.e., an upper FET) stacked on the first FET. The metal components can include at least one embedded contact in a source/drain region of the first FET. This embedded contact can be electrically connected to a wire (e.g., either a power wire or a signal wire). This wire could be a buried wire (also referred to as a front end of the line (FEOL) wire) that is positioned laterally adjacent to the source/drain region and the embedded contact can extend laterally beyond the source/drain region to that buried wire. Alternatively, the wire could be a metal level wire (also referred to herein as a back end of the line (BEOL) wire) that is positioned in a metal level above the second FET. In this case, an insulated contact (i.e., a contact that is wrapped by a dielectric sidewall spacer) can extend vertically from the embedded contact through the second FET to the metal level wire.

More particularly, referring to FIGS. 1A-1E, disclosed herein are embodiments of an integrated circuit (IC) structure 100.

The IC structure 100 can include a semiconductor substrate 101. The semiconductor substrate 101 can be made of a first semiconductor material (e.g., monocrystalline silicon). The semiconductor substrate 101 can be a bulk semiconductor structure. Alternatively, the semiconductor substrate 101 can be a semiconductor layer of a semiconductor-on-insulator (SOI) substrate.

The IC structure 100 can further include an isolation region 102 (e.g., a trench isolation region) that defines and, particularly, laterally surrounds an essentially fin-shaped portion of the semiconductor substrate 101. The isolation region 102 can include a trench, which is in an upper portion of the semiconductor substrate 101 and defines the fin-shaped portion. The isolation region 102 can, optionally, be lined with a thin conformal dielectric layer of a first dielectric material (e.g., silicon nitride) and can be filled with a blanket dielectric layer of a second dielectric material (e.g., silicon dioxide) that is different from the first dielectric material.

The IC structure 100 can further include at least one stacked pair of field effect transistors (FETs) on the top surface of the semiconductor substrate 101 and, particularly, aligned above the fin-shaped portion of the semiconductor substrate 101. The IC structure 100 can also include various metal components (i.e., embedded contact(s), buried wire(s), insulated contact(s), middle of the line (MOL) contacts, metal level wire(s), etc.) that enable power and/or signal connections to the source/drain regions of the FETs in the stacked pair and that facilitate size scaling of cells that incorporate the stacked pairs by reducing the number of metal tracks required.

For purposes of illustration, FIGS. 1A-1E show a portion of an exemplary cell that includes two immediately adjacent stacked pairs 150, 155 of gate-all-around field effect transistors (GAAFETs). However, it should be understood that FIGS. 1A-1E are not intended to be limiting and that different embodiments of the disclosed IC structure can include one or more stacked pairs of different types of FETs (e.g., any other FETs suitable for stacking) and can further include different combinations of the metal components and, particularly, different combinations of the embedded contact(s), buried wire(s), insulated contact(s) and/or metal level wire(s) that are described below.

In any case, each stacked pair 150, 155 of FETs can include a first FET 110, 130 (also referred to herein as a lower FET) on the semiconductor substrate 101 above the level of the isolation region 102, a second FET 120, 140 stacked above the first FET 110, 130, and a shared gate 151, 156 (e.g., a shared single or dual work function replacement metal gate (RMG)).

The first FET 110, 130 can be a first-type FET (e.g., a P-type FET) and can include first source/drain regions 112a-112b, 132a-132b and at least one first channel region 111, 131 positioned laterally between the first source/drain regions 112a-112b, 132a-132b. That is, the first channel region(s) 111, 131 can have opposing ends that are immediately adjacent to the first source/drain regions 112a-112b, 132a-132b. For purposes of illustration, the first FET 110, 130 in each stacked pair is shown as having one first channel region 111, 131. However, it should be understood that, alternatively, the first FET 110, 130 could have any number of one or more first channel regions.

The first source/drain regions 112a-112b, 132a-132b can be made of an epitaxial semiconductor material, which is doped so as to have the first-type conductivity (e.g., P-type conductivity) at a relatively high conductivity level. The first channel region(s) 111, 131 can be made of a semiconductor material, which is either undoped or, optionally, doped so as to have the second-type conductivity (e.g., N-type conductivity) at a relatively low conductivity level. The epitaxial semiconductor material of the first source/drain regions 112a-112b, 132a-132b and the semiconductor material of the first channel region(s) 111, 131 can be the same semiconductor material (e.g., silicon or any other suitable semiconductor material). Alternatively, the epitaxial semiconductor material of the first source/drain regions 112a-112b, 132a-132b and the semiconductor material of the first channel region(s) 111, 131 can be different and pre-selected for optimal charge carrier mobility within the first channel region(s).

The second FET 120, 140 can be a second-type FET that is different from the first-type conductivity (e.g., an N-type FET). The second FET 120, 140 can include second source/drain regions 122a-122b, 142a-142b and at least one second channel region 121, 141 positioned laterally between the second source/drain regions 122a-122b, 142a-142b. That is, the second channel region(s) 121, 141 can have opposing ends that are immediately adjacent to the second source/drain regions 122a-122b, 142a-142b. The second source/drain regions 122a-122b, 142a-142b and the second channel region(s) 121, 141 can be aligned above the first source/drain regions 112a-112b, 132a-132b and the first channel region(s) 111, 131, respectively, and the second source/drain regions 122a-122b, 142a-142b can be electrically isolated from the first source/drain regions 112a-112b, 132a-132b by at least one relatively thin conformal dielectric layer 103, 104 of the first dielectric material (e.g., silicon nitride) that covers the first source/drain regions 112a-112b, 132a-132b. For purposes of illustration, the second FET 120, 140 in each stacked pair of FETs is shown as having two second channel regions 121, 141. However, it should be understood that, alternatively, the second FET 120, 140 could have any number of one or more second channel regions 121, 141.

The second source/drain regions 122a-122b, 142a-142b can be made of an epitaxial semiconductor material, which is doped so as to have the second-type conductivity (e.g., N-type conductivity) at a relatively high conductivity level. The second channel region(s) 121, 141 can be made of a semiconductor material, which is either undoped or, optionally, doped so as to have the first-type conductivity (e.g., P-type conductivity) at a relatively low conductivity level. The epitaxial semiconductor material of the second source/drain regions 122a-122b, 142a-142b and the semiconductor material of the second channel region(s) 121, 141 can be the same semiconductor material (e.g., silicon or any other suitable semiconductor material). Alternatively, the epitaxial semiconductor material of the second source/drain regions 122a-122b, 142a-142b and the semiconductor material of the second channel region(s) 121, 141 can be different and pre-selected for optimal charge carrier mobility within the second channel region(s).

It should be noted that, for purposes of illustration, the FETs in a given stacked pair of FETs are described above as having different type conductivities. For example, a given stacked pair of FETs could include an N-type FET on a P-type FET or vice versa. However, it should be understood that, alternatively, a given stacked pair of FETs could include FETs having the same type conductivity (e.g., an N-type FET on another N-type FET or a P-type FET on another P-type FET).

It should further be noted that, when the IC structure includes multiple stacked pairs of FETs, adjacent first FETs (e.g., adjacent lower FETs) can have a shared first source/drain region and adjacent second FETs (e.g., adjacent upper FETs) can have a shared second source/drain region. That is, instead of having discrete, source/drain regions that are electrically isolated from each other (e.g., by an isolation region) adjacent FETs can have a shared source/drain region that extends between their respective channel regions. For example, as shown in FIG. 1A, the first FET 110 is adjacent to the first FET 130 and a shared first source/drain region 112*b*/132*a* extends between first channel region(s) 111 of the first FET 110 and first channel region(s) 131 of the first FET 130. Similarly, the second FET 120 is adjacent to the second FET 140 and a shared second source/drain region 122*b*/142*a* extends between the second channel region(s) 121 of the second FET 120 and second channel region(s) 141 of the second FET 140.

It should further be noted that, when the IC structure includes one or more stacked pairs of GAAFETs (as illustrated), the first channel region(s) 111, 121 of the first GAAFET 110, 130 and the second channel region(s) 131, 141 of the second GAAFET 120, 130 can be in the form of elongated semiconductor nanoshapes (NSs). For purposes of this disclosure, an elongated semiconductor nanoshape (NS) refers to a feature having a length that is relatively long as compared to its thickness (also referred to herein as its height) and/or its width (also referred to herein as its depth) and further having its thickness and/or its width dimensions constrained to tens of nanometers or less (i.e., constrained to 100 nm or less). Nanoshapes include nanowires, nanosheets and nanofins. Specifically, a nanowire (NW) refers to a nanoshape having both its thickness (or height) and its width dimensions constrained to tens of nanometers or less (i.e., constrained to 100 nm or less) and preferably having the ratio of the thickness dimension to the width dimension being, for example, approximately 1 to 1. A nanosheet refers to a nanoshape having its thickness dimension (or height) constrained to tens of nanometers or less (i.e., constrained to 100 nm or less), having its width dimension above 100 nm, and having the ratio of the thickness dimension to the width dimension being, for example, significantly over 1 to 1 (e.g., 2 to 1, 5 to 1, 10 to 1, 100 to 1, etc.). That is, a nanosheet is relatively short and wide. A nanofin refers to a nanoshape having its width dimension constrained to tens of nanometers or less (i.e., constrained to 100 nm or less), having its thickness (or height) dimension being greater than 100 nm and having the ratio of the thickness dimension to the width dimension being, for example, significantly less than 1 to 1 (e.g., 1 to 2, 1 to 5, 1 to 10, 1 to 100, etc.). That is, a nanofin is relatively tall and thin. In any case, these elongated semiconductor nanoshapes are horizontally oriented relative to the top surface the substrate. The lowest first channel region can be physically separated from the top surface of the substrate. Each additional first channel region (if any) can be aligned above, parallel to, and physically separated from the one below. The lowest second channel region can be aligned above, parallel to, and physically separated from the highest first channel region. Each additional second channel region (if any) can be aligned above, parallel to, and physically separated from the one below.

In each stacked pair of FETs, the shared gate 151, 156 can have a lower section (l) adjacent to the first channel region(s) 111, 131 and an upper section (u) adjacent to the second channel region(s) 121, 141. For example, when the IC structure includes one or more stacked pairs of GAAFETs (as illustrated), the lower section (l) can be on the substrate and can wrap around the first channel region(s) 111, 131 (i.e. can be above, below and on the opposing sides of the first channel region(s) 111, 131) of the first GAAFET 110, 130. The upper section (u) can be above the lower section (l) and can wrap around the second channel region(s) 121, 141 (i.e. can be above, below and on the opposing sides of the second channel region(s) 121, 141) of the second GAAFET 120, 140.

The shared gate 151, 156 can, for example, be a single work function replacement metal gate (RMG). Alternatively, the shared gate 151, 156 can be a dual work function RMG. That is, in both the lower and upper sections, the shared gate 151, 156 can include a conformal gate dielectric layer (e.g., a conformal high-K gate dielectric layer) immediately adjacent to (e.g., wrapping around) the first channel region(s) and the second channel region(s). In the lower section (l), the shared gate 151, 156 can further include a conformal first work function metal layer immediately adjacent to that portion of the gate dielectric layer on the first channel region(s). The first work function metal layer can be preselected for optimal performance of a first-type FET (e.g., a P-type FET). In the upper section (u), the shared gate 151, 156 can further include a conformal second work function metal layer, which is different from the first work function metal layer, which is immediately adjacent to the portion of the gate dielectric layer on the second channel region(s), and which is preselected for optimal performance of a second-type FET (e.g., an N-type FET). Optionally, the shared gate 151, 156 can further include a conductive fill material adjacent to the first work function metal layer in the lower section and further adjacent to the second work function metal layer in the upper section. Shared dual work function RMGs for stacked pairs of FETs are well known in the art. Thus, in order to avoid clutter in the drawings and allow the reader to focus on the salient aspects of the disclosed embodiments, only the shared RMGs 151, 156, as a whole, are identified in the figures and the individual components of these shared RMGs (e.g., the gate dielectric layer, the different work function metal layers, the conductive fill material, etc.) are not specifically identified.

In any case, each shared gate 151, 156 can have a dielectric gate cap 157 and dielectric gate sidewalls spacers 107. The gate cap 157 and gate sidewall spacers 107 can be made of the same dielectric material (e.g., silicon nitride or any other suitable dielectric material). Alternatively, the gate cap 157 and gate sidewall spacers 107 can be made of different dielectric materials. For example, the gate cap 157 can be made of silicon nitride and the gate sidewall spacers 107 can be made of silicon carbon nitride, silicon boron carbon nitride or any other suitable dielectric material.

Furthermore, when the IC structure 100 includes one or more stacked pairs of GAAFETS (as illustrated), a combination of the gate sidewall spacers 107 and vertically oriented isolation elements 108 can electrically isolate the shared gate 151, 156 from the adjacent source/drain regions. The vertically oriented isolation elements 108 can be on opposing sides of each shared gate 151, 156 positioned laterally adjacent to sections of vertical surfaces of the shared gate that extend from the top of the substrate to the bottom of the lowest first channel region and that further extend between adjacent channel regions. The isolation elements can be, for example, nitride layers (e.g., silicon nitride layers) or layers of any other suitable isolation material.

As mentioned above, the IC structure 100 can further include various metal components (i.e., embedded contact(s), buried wire(s), insulated contact(s), metal level wire(s), etc.) that enable power and/or signal connections to the source/drain regions of the FETs and that facilitate size scaling of cells that incorporate the stacked pairs by reducing the number of metal tracks required.

Specifically, these metal components can include one or more embedded contacts (e.g., embedded metal contacts) in one or more of the source/drain regions within a stacked pair of FETs.

For example, the embedded contact(s) can include an embedded contact in a first source/drain region of a first FET (i.e., of a lower FET). See the embedded contact 161 in the first source/drain region 112*a* of the first FET 110 in the stacked pair 150 (shown in FIG. 1B); see also the embedded contact 163 in the shared first source/drain region 112*b*/132*a* of the adjacent first FETs 110, 130 in the stacked pairs 150, 155 (shown in FIG. 1C); and see also the embedded contact 162 in the first source/drain region 132*b* of the first FET 130 in the stacked pair 155 (shown in FIG. 1D). Such an embedded contact 161, 162 or 163 in a first source/drain region of a first FET (i.e., of a lower FET) can further be electrically connected to a wire. The wire can be either a power wire or a signal wire and can further be a buried wire (also referred to herein as a front end of the line (FEOL) wire) or a metal level wire (also referred to herein as a back end of the line (BEOL) wire). For purposes of this disclosure, a buried wire or FEOL wire refers to a wire that is formed the same level or below the active semiconductor device level and, particularly, below any middle of the line (MOL) or BEOL structures.

Thus, as illustrated in FIGS. 1B-1E, the metal components can further include a first buried wire electrically connected to one or more embedded contacts in one or more first source/drain regions of one or more first FETs of one or more stacked pairs of FETs, respectively. For example, a blanket dielectric layer of the second dielectric material 106 can laterally surround the first source/drain regions. A first buried wire 171 can be buried within this second dielectric material 106 such that it is positioned laterally adjacent to and at the same level as first source/drain regions 112*a*-112*b*, 132*a*-132*b* of first FET(s) 110, 130 on a first side of one or more stacked pairs 150, 155 of FETs in a cell. This first buried wire 171 can be oriented essentially parallel to the first source/drain regions 112*a*-112*b*, 132*a*-132*b* and perpendicular to the shared gate(s) 151, 156 (e.g., see the layout shown in FIG. 1E). An embedded contact 161 in a first source/drain region 112*a* of the first FET 110 can extend laterally beyond a side edge of the first source/drain region 112*a* through the second dielectric material 106 to the first buried wire 171 such that it directly contacts the first buried wire 171 (see FIG. 1B). Other first source/drain regions of other first FETs of other stacked pairs of FETs can also be electrically connected to this first buried wire 171. For example, additionally or alternatively, an embedded contact 162 in a first source/drain region 132*b* of the first FET 130 can extend laterally beyond a side edge of the first source/drain region 132*b* through the second dielectric material 106 to the first buried wire 171 such that it directly contacts the first buried wire 171 (see FIG. 1D). As discussed in greater detail below with regard to an exemplary method of forming the IC structure 100 shown in FIGS. 1A-1E, the wire trench and contact openings for the first buried wire 171 and the embedded contacts 161-163, respectively, can be patterned using separate patterning steps. Optionally, separate metallization steps can be performed after each patterning step in order to fill the wire trench and contact openings, respectively. Alternatively, back-to-back patterning steps can be performed such that the contact openings for the embedded contacts 161 and 162 abut and particularly intersect the wire trench and a single metallization process can be performed such that the first buried wire 171 and the embedded contacts 161 and 162 are different portions of a single contiguous metal feature.

Figure 1C:
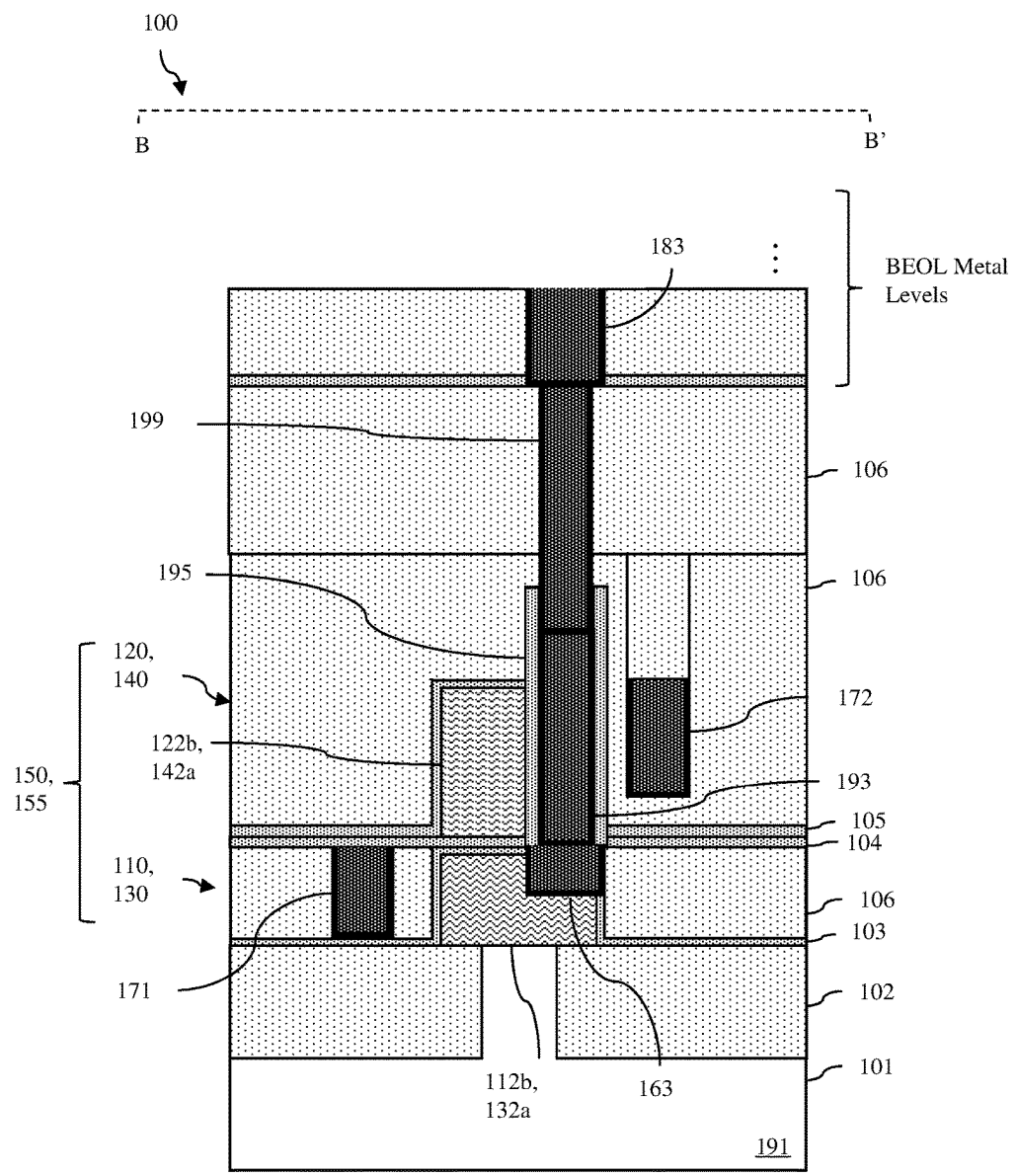
Figure 1D:
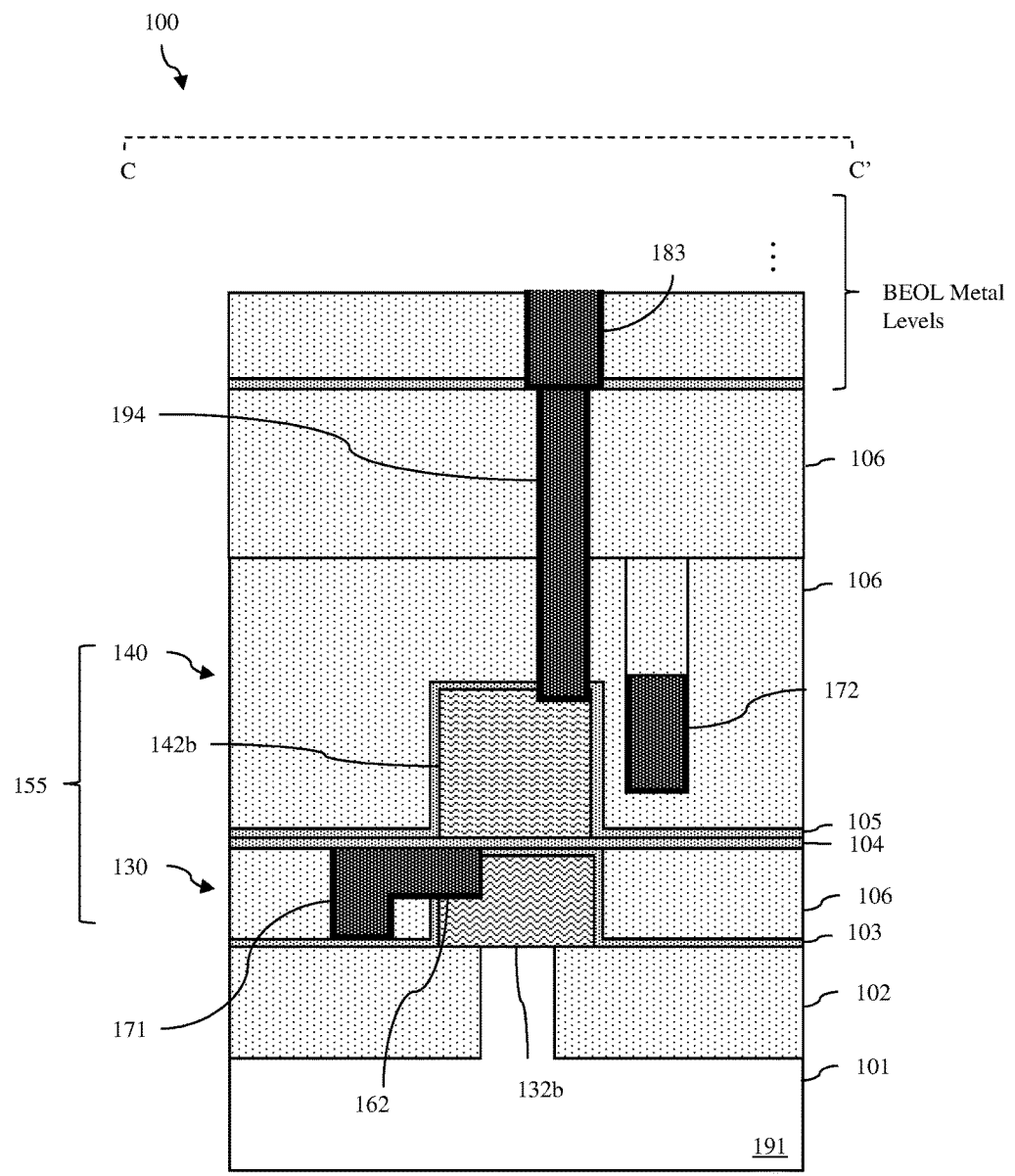
Figure 1E:
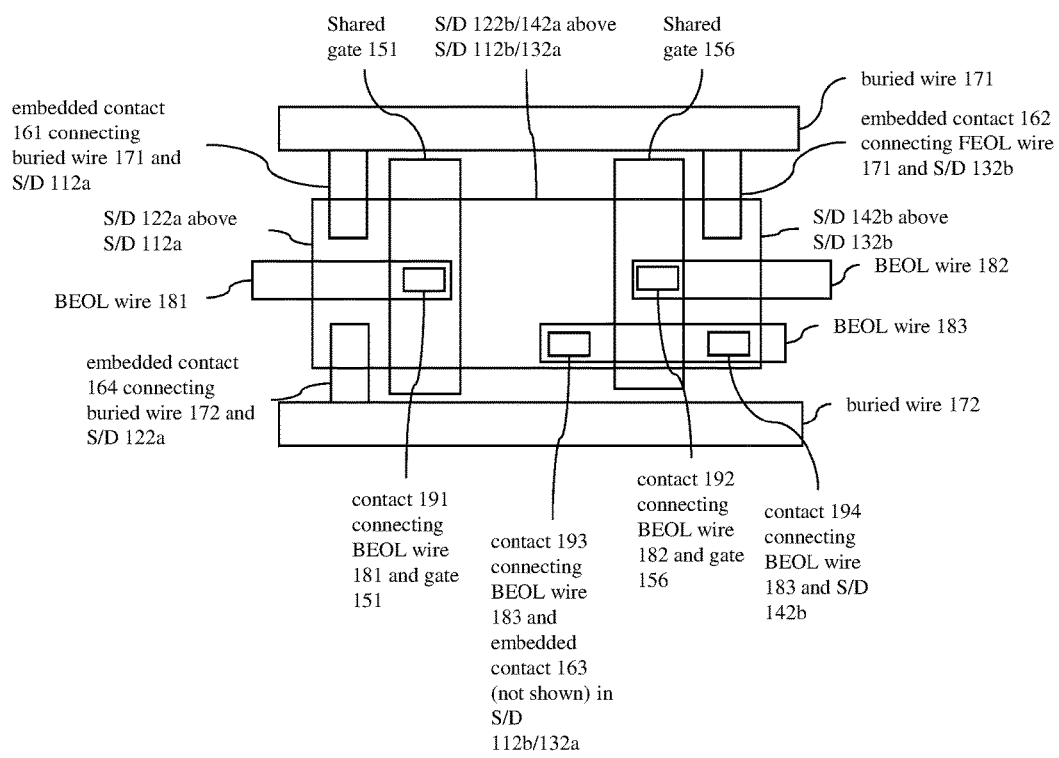

Additionally or alternatively, as illustrated in FIG. 1C-1E, the metal components can further include a metal level wire in a BEOL metal level and insulated contact(s) that enable the metal level wire to be electrically connected to one or more embedded contacts in one or more first source/drain regions of one or more first FETs of one or more stacked pairs of FETs, respectively. For example, a metal level wire 183 can be in a BEOL metal level above the second FET 120, 140 (e.g., on the second side of the one or more stacked pairs 150, 155 of FETs in the cell) and can be oriented essentially perpendicular to the shared gate(s) 151, 156 (e.g., see the layout shown in FIG. 1E). An embedded contact in a first source/drain region (see the embedded contact 163 in the shared first source/drain region 112*b*/132*a* of the first FETs 110 and 130) can be electrically connected to this metal level wire 183 through an insulated contact 193 (see FIG. 1C). The insulated contact 193 can extend vertically from the embedded contact 163 through the second FET 120, 140 (e.g., through the shared second source/drain region 122*b*/142*a* above) and into one or more layers of interlayer dielectric (ILD) material (e.g., through one or more layers of second dielectric material 106 and, optionally, other ILD materials). Depending upon the height of this insulated contact 193, it can be electrically connected to a metal level wire 183 either directly or through a middle of the line (MOL) contact 199, as discussed in greater detail below. The insulated contact 193 can include a pillar of metal contact material with essentially vertical sidewalls and a dielectric sidewall spacer 195. The dielectric sidewall spacer 195 (e.g., a silicon nitride sidewall spacer or a sidewall spacer made of some other suitable dielectric material) can cover the vertical sidewalls of at least a lower portion of the pillar. That is, the dielectric sidewall spacer 195 can laterally surround (i.e., wrap around the sides of) at least the lower portion of the pillar such that it extends vertically from the embedded contact 163 to some level above the top of the second source/drain region 122*b*/142*a*. Thus, the dielectric sidewall spacer 195 physically separates and electrically isolates the metal contact material from the second source/drain region 122*b*/142*a*.

Additionally or alternatively, the embedded contact(s) can include an embedded contact in a second source/drain region of a second FET (i.e., of an upper FET). See the embedded contact 164 in the second source/drain region 122*a* of the second FET 120 in the stacked pair 150 (shown in FIG. 1B). Such an embedded contact 164 in a second source/drain region of a second FET (i.e., of an upper FET) can further be electrically connected to a wire. The wire can be either a power wire or a signal wire. The wire can be a buried wire (also referred to herein as a front end of the line (FEOL) wire). That is, the metal components can further include a second buried wire electrically connected to one or more embedded contacts in one or more second source/drain regions of one or more second FETs of one or more stacked pairs of FETs, respectively. For example, as illustrated in FIGS. 1B-1E, a blanket dielectric layer of the second dielectric material 106 can laterally surround the second source/drain regions. A second buried wire 172 can be buried within this second dielectric material 106 such that it is positioned laterally adjacent to and at the same level as second source/drain regions 122*a*-122*b*, 142*a*-142*b* of second FET(s) 120, 140 on a second side of one or more stacked pairs 150, 155 of FETs in a cell opposite the first side. This second buried wire 172 can be oriented essentially parallel to the second source/drain regions 122a-122b, 142a-142b and perpendicular to the shared gate(s) 151, 156 (e.g., see the layout shown in FIG. 1E). An embedded contact 164 in a second source/drain region 122a of the second FET 120 can extend laterally beyond a side edge of the second source/drain region 122a through the second dielectric material 106 to the second buried wire 172 such that it directly contacts the second buried wire 172 (see FIG. 1B). As discussed in greater detail below with regard to an exemplary method of forming the IC structure 100 shown in FIGS. 1A-1E, the wire trench and contact opening for the second buried wire 172 and the embedded wire contact 164 can be patterned using separate patterning steps. Optionally, separate metallization steps can be performed after each patterning step in order to fill the wire trench and contact opening, respectively. Alternatively, back-to-back patterning steps can be performed such that the contact opening for the embedded wire contact 164 abuts and particularly intersect the wire trench and a single metallization process can be performed that the second buried wire 172 and the embedded contact 164 are different portions of a single contiguous metal feature. Alternatively, the wire can be a metal level wire (not shown).

It should be noted that conventional middle of the line (MOL) contacts can electrically connect metal level wires to one or more second source/drain regions of one or more second FETs (upper FETs) of one or more stacked pairs of FETs, respectively. For example, as illustrated in FIGS. 1D and 1E, the MOL contact 194 electrically connects the second source/drain region 142b of the second GAAFET 140 in the stacked pair 155 of GAAFETs to the metal level wire 183. Furthermore, optionally and as mentioned above, if an insulated contact is not sufficiently tall to reach a metal level wire (e.g., the metal level wire 183), an additional MOL contact 199 can extend vertically from the metal level wire 183 through one or more layers of dielectric material (e.g., through the second dielectric material 106) to the insulated contact 193 (see FIG. 1C). Additional MOL contacts can also electrically connect metal level wires to shared gates. For example, as illustrated in FIGS. 1A and 1E, the MOL contacts 185 and 186 electrically connect the shared gates 151 and 156 to the metal level wires 181 and 182, respectively.

As mentioned above, FIGS. 1A-1D are not intended to be limiting and that different embodiments of the disclosed IC structure 100 could, alternatively, include one or more stacked pairs of different types of FETs. Additionally, different embodiments could include different combinations of the above-described metal components. For example, an embodiment of the IC could include one or more stacked pairs of FINFETs. Furthermore, different embodiments of the IC structure could include embedded contacts 163 in first source/drain regions connected to metal level wires through insulated contacts 193, but no first buried wire 171 and embedded contacts 161-162 in first source/drain regions connected thereto, or vice versa.

Figure 2A:
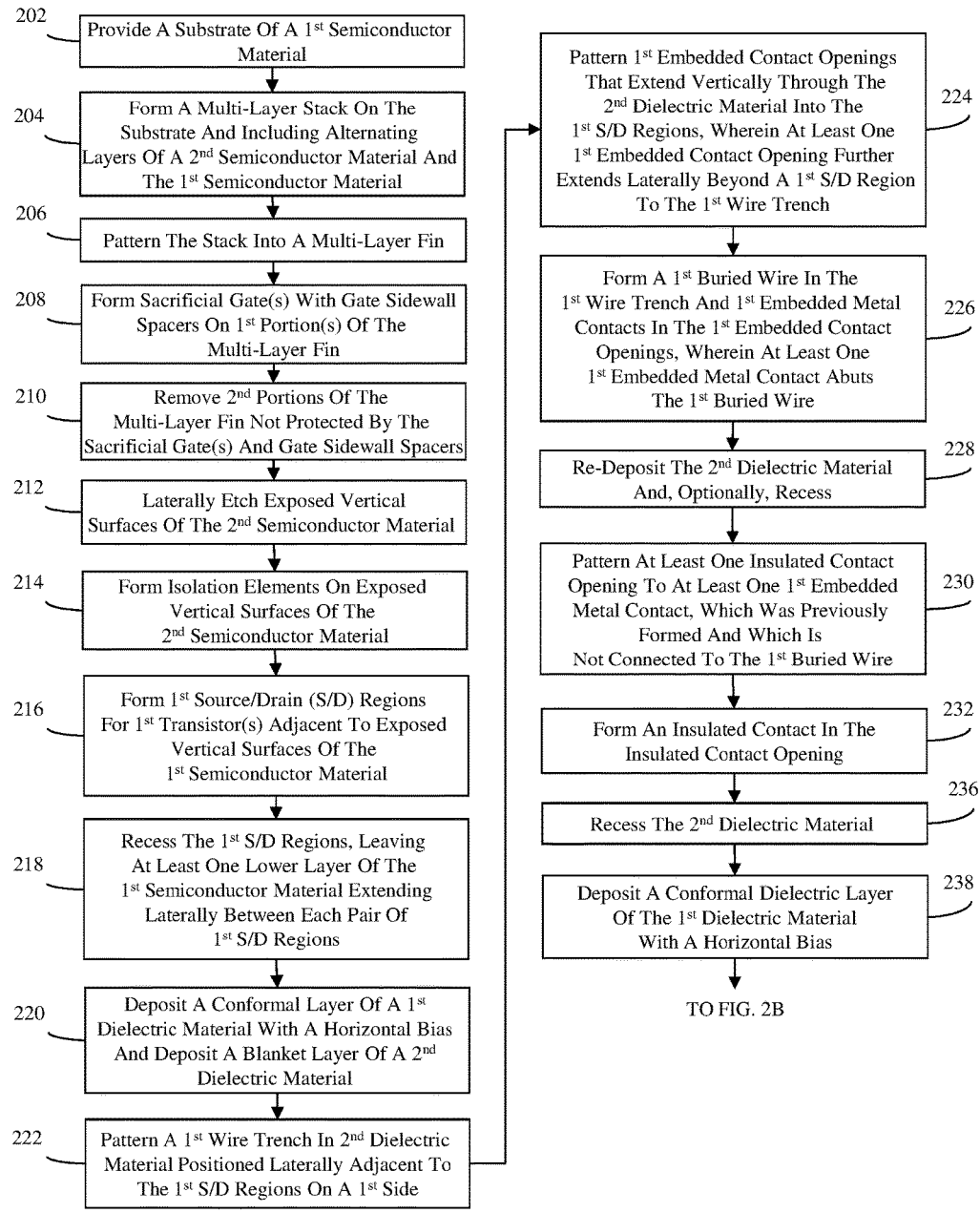
FIGS. 2A-2B are a flow diagram illustrating an embodiment of a method of forming the IC structure of FIGS. 1A-1E.
Figure 2B:
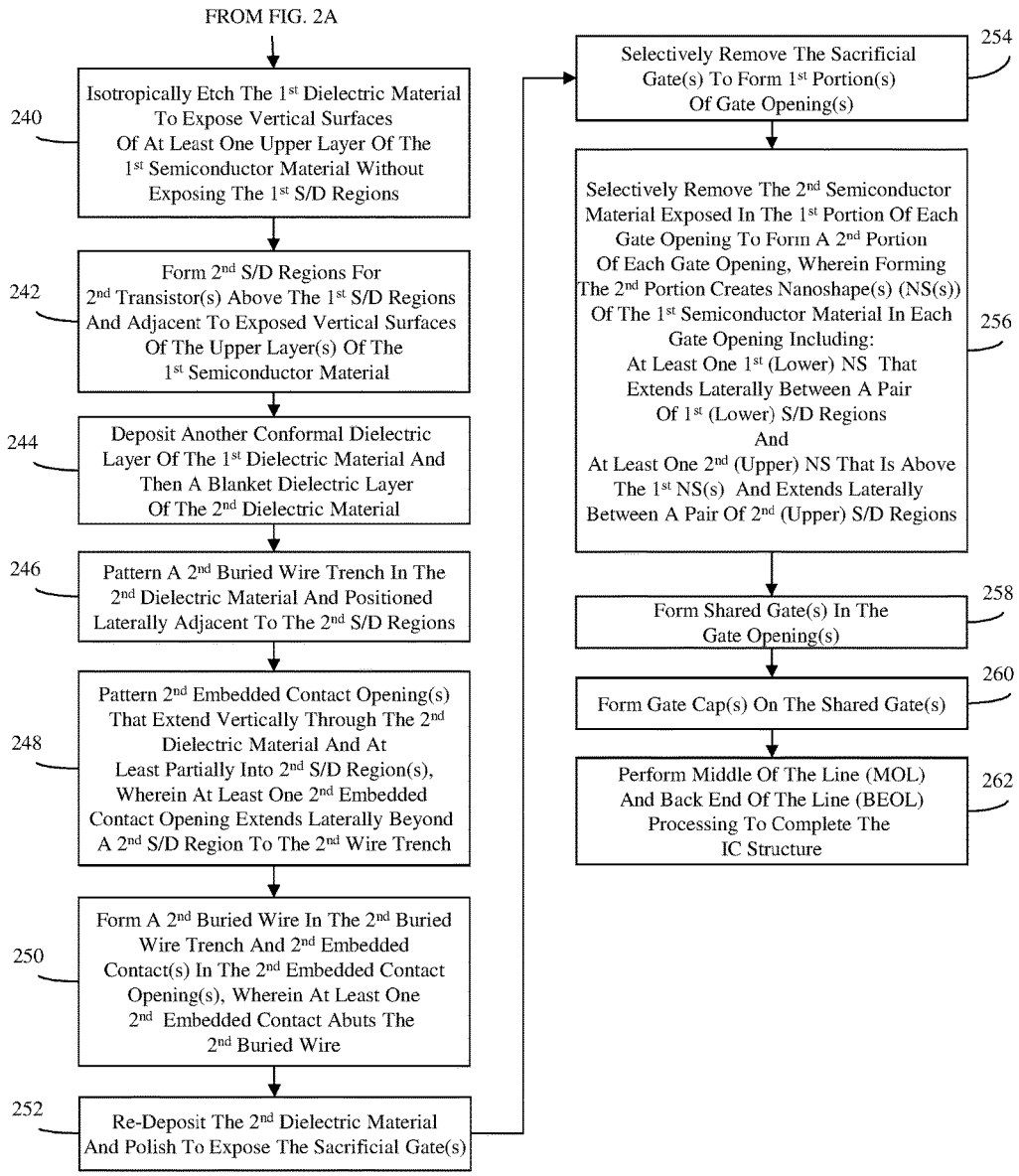

The flow diagram of FIGS. 2A-2B illustrates an exemplary method for forming the IC structure 100, as it is shown in FIGS. 1A-1E.

Figure 3A:
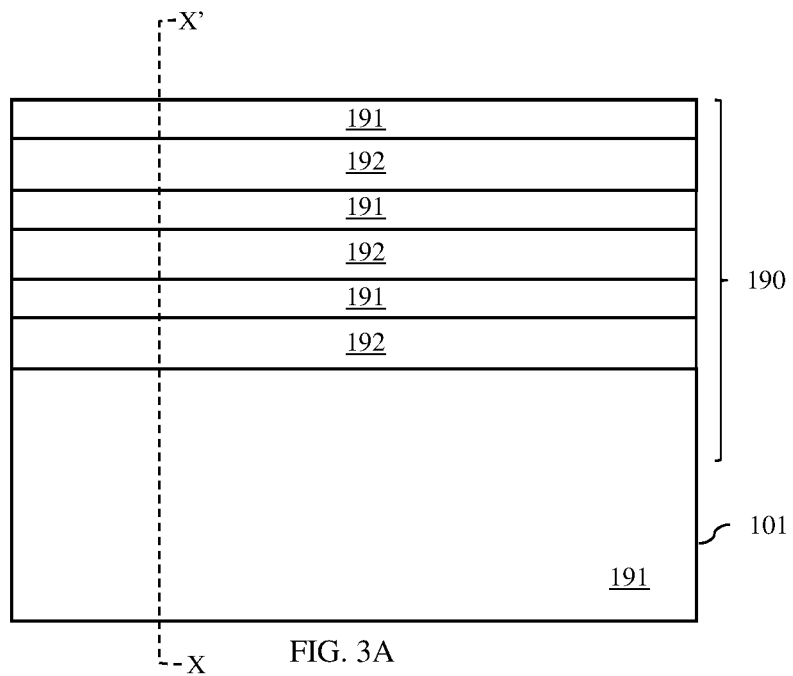
FIGS. 3A-3B are cross-section diagrams of a partially completed IC structure formed according to the flow diagram of FIGS. 2A-2B.

The method can include providing a semiconductor substrate 101 (see process 202 and FIG. 3A). The semiconductor substrate 101 made of a first semiconductor material 191. This first semiconductor material 191 can be, for example, monocrystalline silicon. The semiconductor substrate 101 can be a bulk semiconductor structure. Alternatively, the semiconductor substrate 101 can be a semiconductor layer of a semiconductor-on-insulator (SOI) structure.

The method can further include forming a multi-layer stack on the semiconductor substrate 101 (see process 204, see FIG. 3A). This multi-layer stack can include alternating semiconductor layers of a second semiconductor material 192 and the first semiconductor material 191. That is, an initial layer of the second semiconductor material 192 can be immediately adjacent to the top surface of the semiconductor substrate 101, an initial layer of the first semiconductor material 191 can be on the initial layer of the second semiconductor material, another layer of the second semiconductor material 192 can be on the initial layer of the first semiconductor material 191, and so on. These alternating layers can be formed, for example, by epitaxial deposition such that the second semiconductor material 192 and the first semiconductor material 191 are different monocrystalline semiconductor materials. For example, as mentioned above, the first semiconductor material 191 can be monocrystalline silicon. The second semiconductor material 192 can be monocrystalline silicon germanium or any other suitable semiconductor material, which can be used to grow monocrystalline silicon and which can be selectively etched away from monocrystalline silicon during subsequent processing.

For purposes of illustration, the multi-layer stack is shown in FIG. 3A as having six total layers including three layers of the second semiconductor material 192 and three layers of the first semiconductor material 191. However, it should be understood that the figures are not intended to be limiting and that, alternatively, the multi-layer stack could include a total of at least four alternating layers including at least two layers of the first semiconductor material 191 so that, in the resulting stacked pairs of GAAFETs, the first GAAFET will have at least one first channel region and the second GAAFET will have at least one second channel region. Additionally, it should be noted that the thickness of each of the layers of the first semiconductor material 191 in the multi-layer stack should be equal to the desired height of the elongated nanoshapes, which will form the first and second channel regions. Furthermore, the thickness of each of the layers of the second semiconductor material should be equal to the desired spacing between stacked elongated nanoshapes and, particularly, should be great enough to allow for gate material deposition between stacked elongated nanoshapes.

Figure 3B:
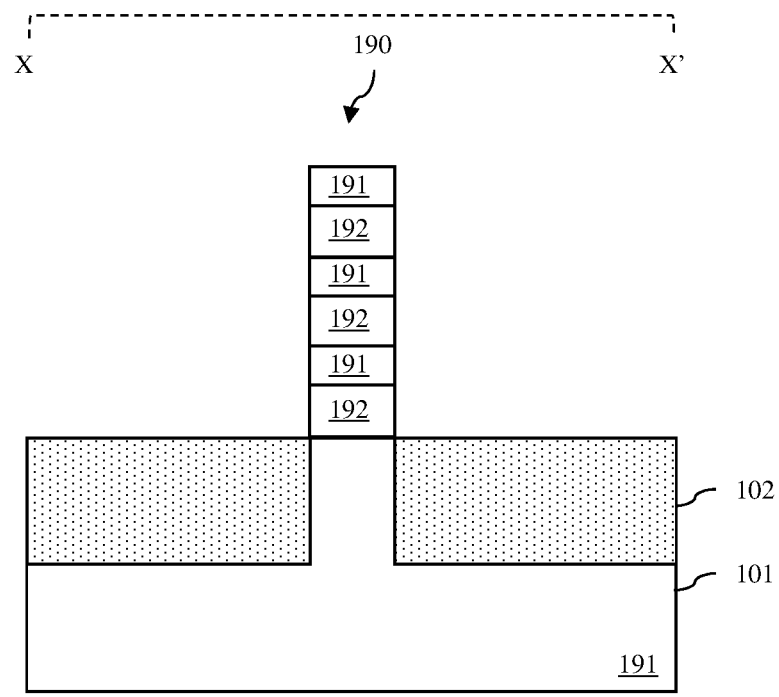

A multi-layer fin 190 can be formed from the multi-layer stack on the semiconductor substrate 101 (see process 206 and FIGS. 3A-3B). For purposes of this disclosure, a "fin" refers to an elongated, relatively tall, essentially rectangular shaped-body. The multi-layer fin 190 can be formed using conventional processing techniques (e.g., lithographic patterning and etch techniques, sidewall image transfer (SIT) techniques, etc.). Etching of the multi-layer fin 190 can include etching a trench in an upper portion of the semiconductor substrate to define a lower portion of the multi-layer fin. Then, an isolation region 102 can be formed on the semiconductor substrate so as to laterally surround the lower portion of the multi-layer fin 190. For example, optionally, a relatively thin conformal dielectric layer of a first dielectric material (e.g., silicon nitride) can be deposited so as to line the trench. A blanket dielectric layer of a second dielectric material (e.g., silicon dioxide or any other suitable isolation material), which is different from the first dielectric material, can be deposited to fill the trench. The dielectric material(s) can subsequently be etched back to form an isolation region 102 (e.g., a trench isolation region) that laterally surrounds the lower portion only of the multi-layer fin 190.

One or more stacked pairs of gate-all-around field effect transistors (GAAFETs) can be formed using the exposed upper portion of the multi-layer fin 190.

Figure 4A:
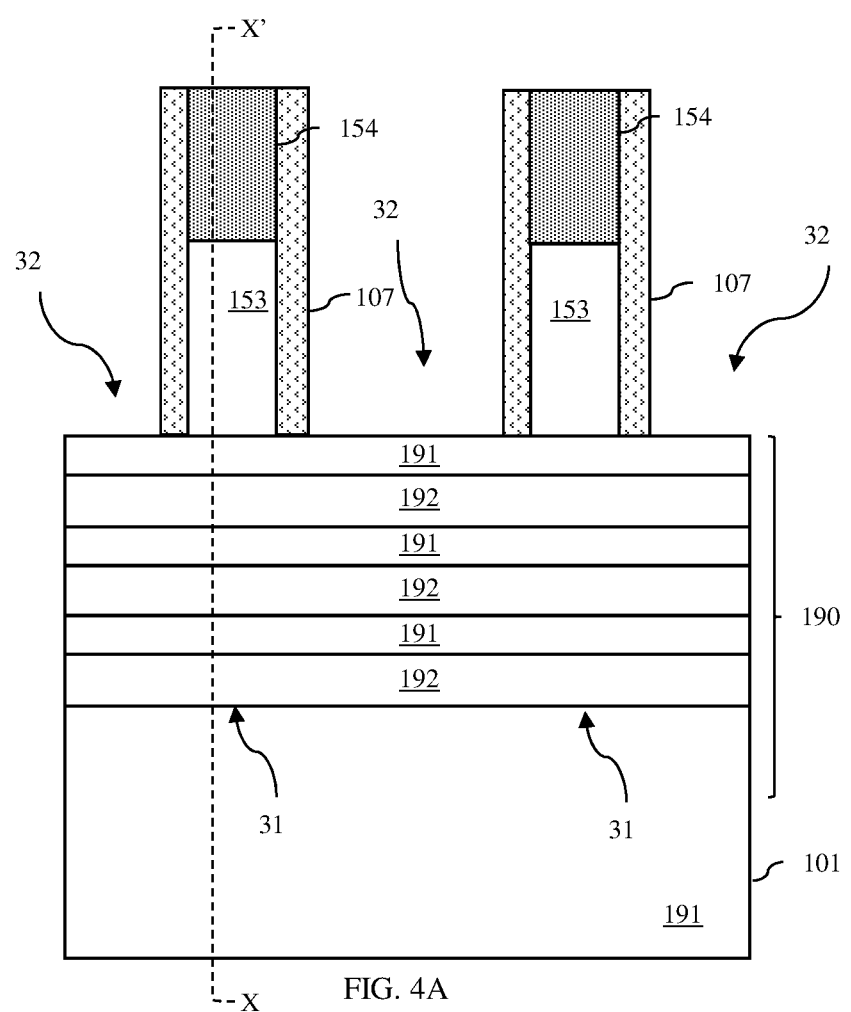
FIGS. 4A-4B are cross-section diagrams of a partially completed IC structure formed according to the flow diagram of FIGS. 2A-2B.
Figure 4B:
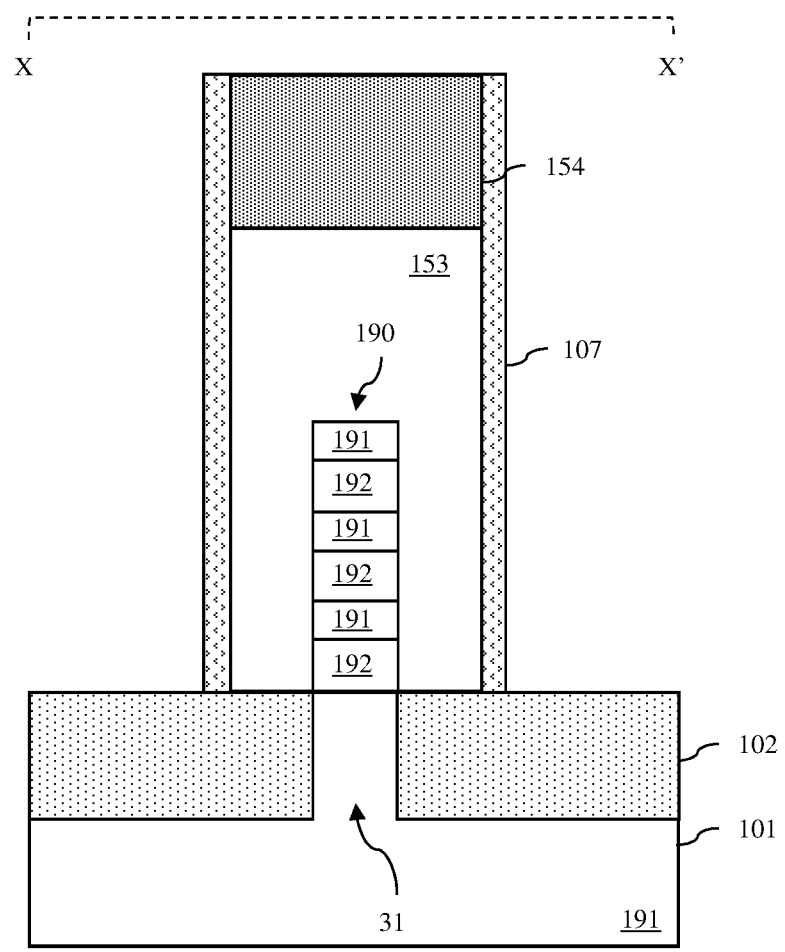

For example, sacrificial gates 153 with sacrificial gate caps 154 and gate sidewall spacers 107 can be formed on first portions 31 (i.e., designated channel areas) of the multi-layer fin 190 such that second portions 32 (i.e., designated source/drain areas) remain exposed (see process 208 and FIGS. 4A-4B). For example, a thin conformal silicon dioxide layer (not shown) can be deposited over the multi-layer fin 190. A blanket sacrificial gate layer can be deposited onto the conformal silicon dioxide layer. This blanket sacrificial gate layer can be, for example, a polysilicon layer, an amorphous silicon layer or any other suitable sacrificial gate material that is different from the materials of the multi-layer fin (i.e., different from the first semiconductor material 191 and the second semiconductor material 192) and that can be selectively and isotropically etched away from the multi-layer fin during subsequent processing. The sacrificial gate layer can then be polished (e.g., using a chemical mechanical polishing (CMP) process) and a sacrificial cap layer (e.g., a silicon nitride cap layer) can be deposited onto the sacrificial gate layer, thereby forming a sacrificial gate stack. The sacrificial gate stack can then be lithographically patterned and etched to form the sacrificial gates 153 (with sacrificial gate caps 154), wherein the sacrificial gates 153 are positioned adjacent to the top surface and the opposing sides of the first portions 31 of the multi-layer fin 190 and are oriented essentially perpendicular to the fin 190. Gate sidewall spacers 107 can then be formed on the sidewalls of the sacrificial gates 153 using conventional sidewall spacer formation techniques. Such sidewall spacer formation techniques are well known in the art and, thus, the details of those techniques have been omitted from the specification in order to allow the reader to focus on the salient aspects of the disclosed method. In any case, the gate sidewall spacers 107 can be made of silicon nitride, silicon carbon nitride, silicon boron carbon nitride or any other suitable sidewall spacer material that is different from the material used for the sacrificial gate 153.

Figure 5:
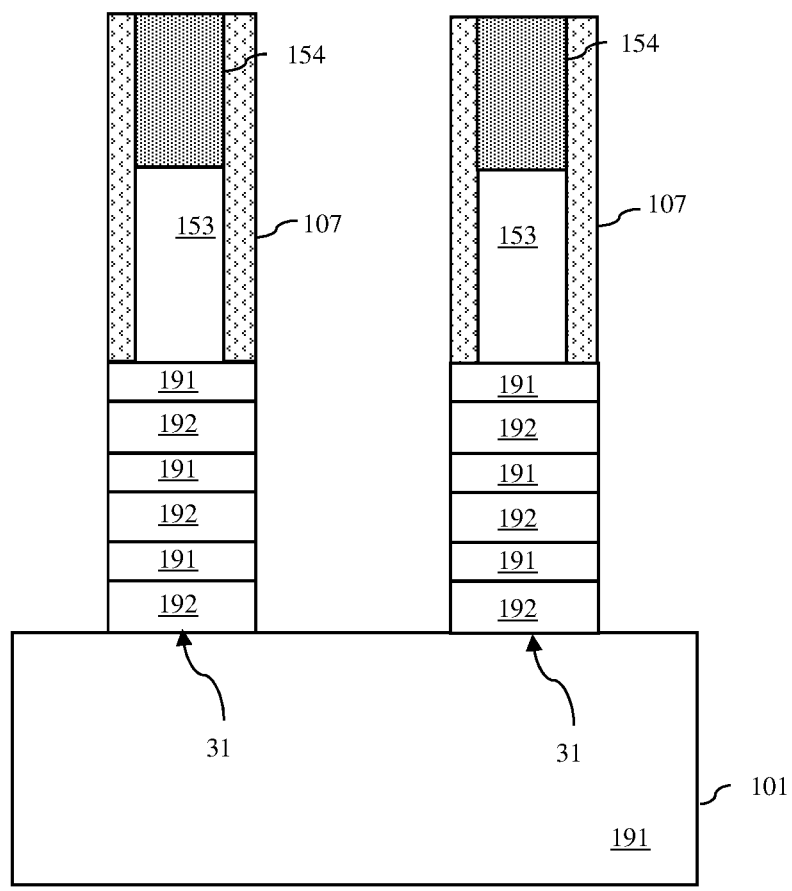
FIG. 5 is a cross-section diagram of a partially completed IC structure formed according to the flow diagram of FIGS. 2A-2B.

The exposed second portions 32 of the multi-layer fin 190 can be selectively removed (see process 210 and FIG. 5). Specifically, an anisotropic etch process can be performed, wherein the etch chemistries used are selective for the materials of the multi-layer fin over the adjacent materials of the isolation region 102, the gate sidewall spacers 107 and the sacrificial gate caps 154. The etch process can be timed so as to stop once the top surface of the isolation region 102 is exposed.

Figure 6:
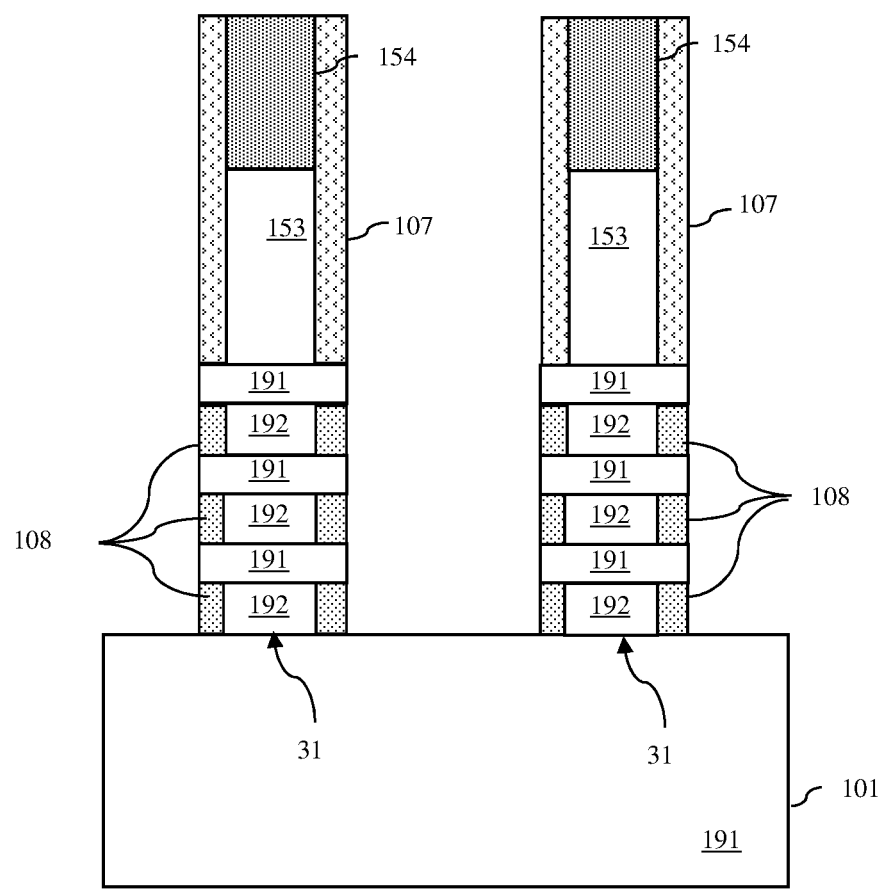
FIG. 6 is a cross-section diagram of a partially completed IC structure formed according to the flow diagram of FIGS. 2A-2B.

After removing the second portions 32 of the multi-layer fin, exposed vertical surfaces of the second semiconductor material 192 in the remaining first portions 31 of the multi-layer fin 190 can be laterally etched to form shallow cavities that undercut the first semiconductor material 191 and these shallow cavities can be filled with an isolation material, thereby forming vertically oriented isolation elements 108 (see processes 212-214 and FIG. 6). Techniques for etching back the vertical surfaces of the second semiconductor material and for forming the isolation elements 108 are well known in the art. Thus, the details of such techniques have been omitted from the specification in order to allow the reader to focus on the salient aspects of the disclosed method.

Figure 7A:
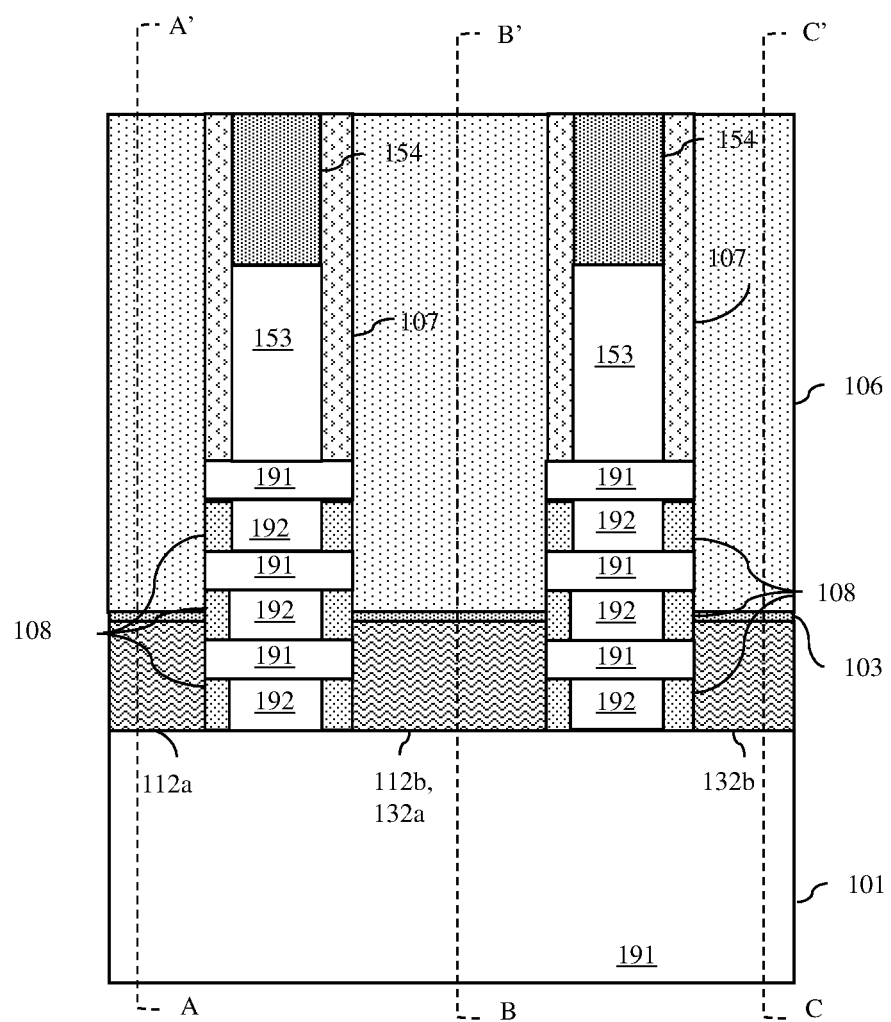
FIGS. 7A-7B are cross-section diagrams of a partially completed IC structure formed according to the flow diagram of FIGS. 2A-2B.
Figure 7B:
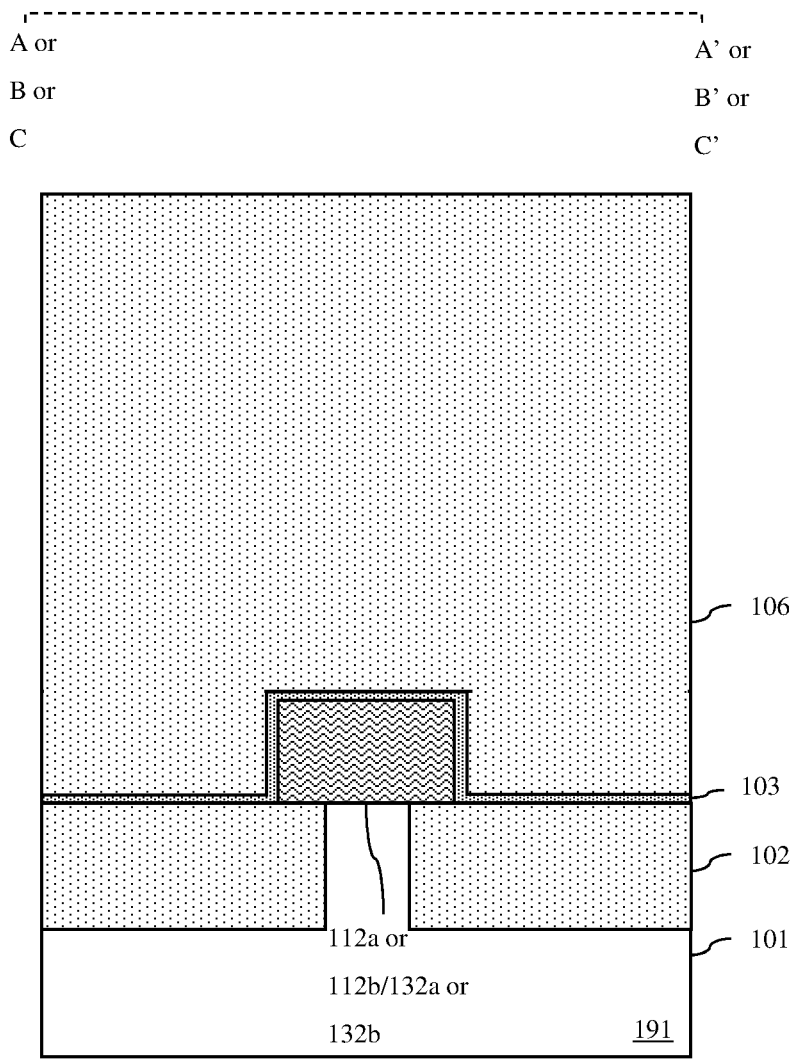

First source/drain regions for first GAAFETs (e.g., for P-type GAAFETs) can then be formed on opposing sides of the sacrificial gates 153 such that they are positioned laterally immediately adjacent to the exposed vertical surfaces of at least one layer of the first semiconductor material 191, but not all layers of the semiconductor material 191 (see processes 216-218 and FIGS. 7A-7B). Specifically, an in situ-doped epitaxial semiconductor material can be deposited on the exposed vertical surfaces of the first semiconductor material 191 and then recessed to the desired level for the first source/drain regions 112a-112b, 132a-132b on opposing sides of the sacrificial gates 153. For example, the in-situ doped semiconductor material can be recessed to a level above only one layer of the first semiconductor material so that in the resulting structure the first GAAFETs will have only one first channel region. Alternatively, the in-situ doped semiconductor material can be recessed to a level above two layers of the first semiconductor material so that in the resulting structure the first GAAFETs will have two first channel regions, and so on. In any case, the in-situ doped semiconductor material should be recessed so that it is below the level of at least one layer of the first semiconductor material so the subsequently formed second GAAFETs will have at least one second channel region, as discussed in greater detail below.

After the first source/drain regions 112a-112b, 132a-132b are formed, a thin conformal dielectric layer 103 of the first dielectric material (e.g., silicon nitride) can be deposited over the partially completed structure (see process 220 and FIGS. 7A-7B). This thin conformal dielectric layer 103 can, for example, be deposited with a horizontal bias (i.e., so that horizontal portions of the layer will be relatively thick as compared to vertical portions). A blanket dielectric layer of the second dielectric material 106 (e.g., silicon dioxide) can then be deposited over the partially completed structure and polished (e.g., using a CMP process) to expose the tops of the sacrificial gate caps 154.

Figure 8A:
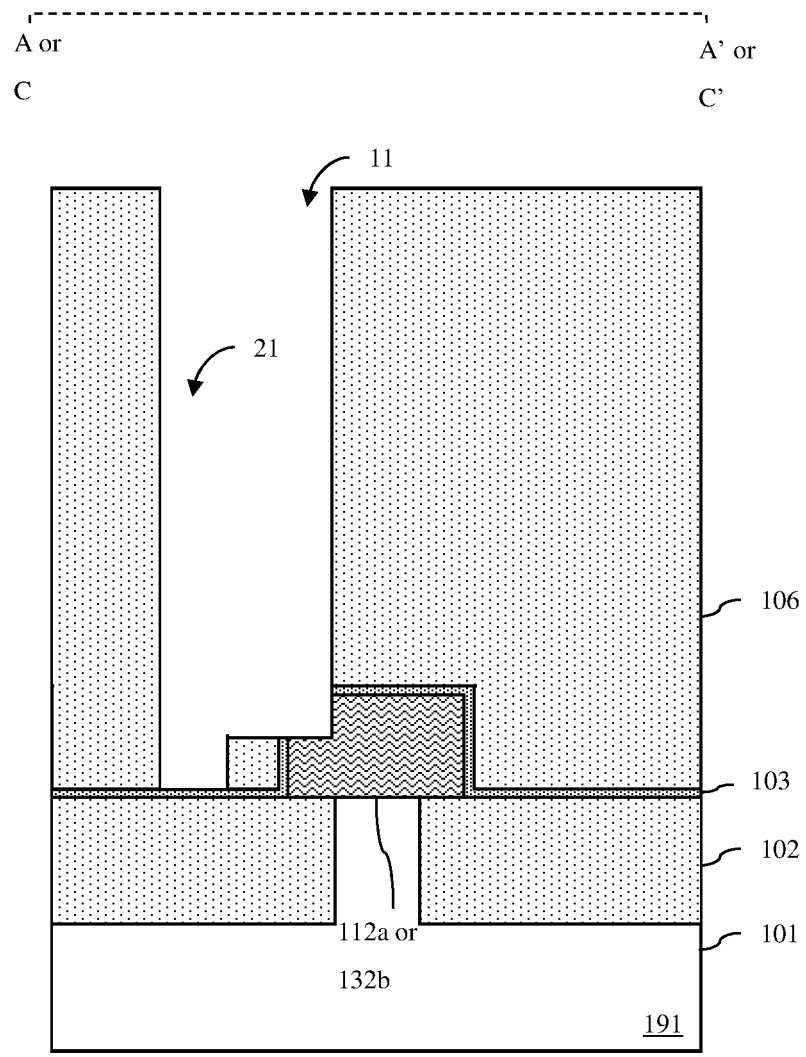
FIGS. 8A-8B are cross-section diagrams of a partially completed IC structure formed according to the flow diagram of FIGS. 2A-2B.
Figure 8B:
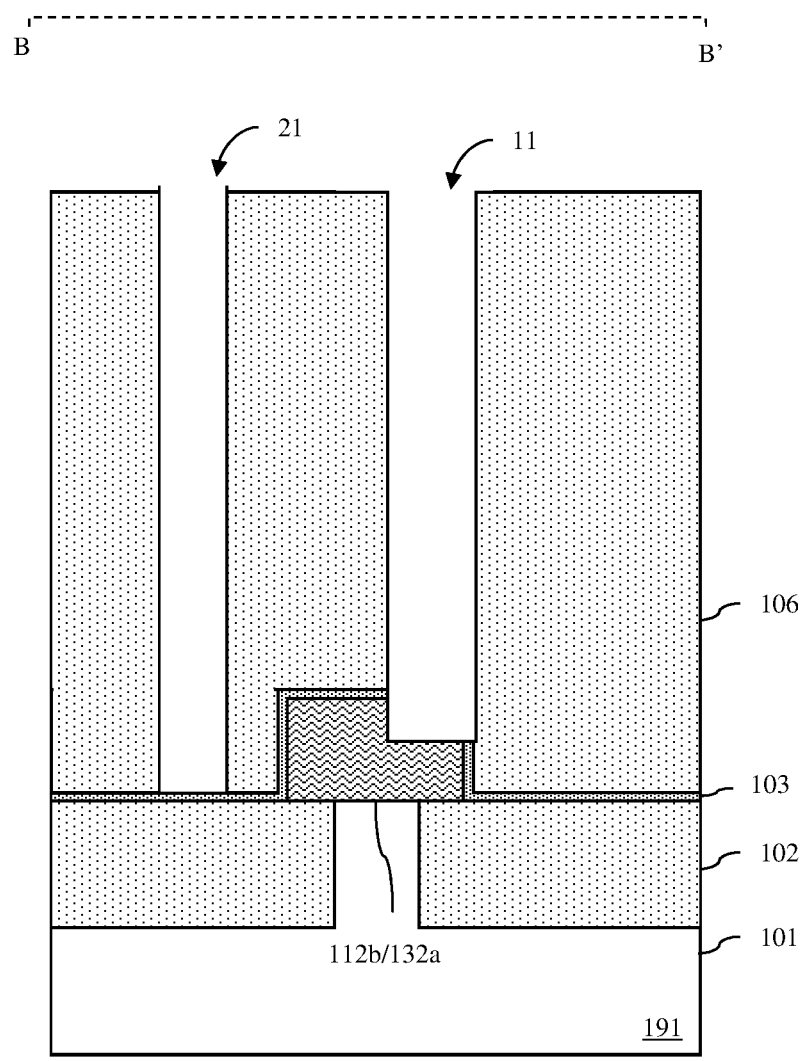

Multiple lithographic patterning and etch processes can be performed in order to form, in the second dielectric material 106 adjacent to the first source/drain regions, a first wire trench 21 for a first buried wire and first embedded contact openings 11 for first embedded contacts in at least some of the first source/drain regions 112a-112b, 132a-132b (see processes 222-224 and FIGS. 8A-8B). The first wire trench 21 can be patterned and etched such that it is positioned laterally adjacent to and at the same level as first source/drain regions 112a-112b, 132a-132b on a first side of the partially completed structure. First embedded contact openings 11 can be patterned and etched such that a bottom surface of each first embedded contact opening is within a corresponding first source/drain region at least some distance below the top surface of that first source/drain region. Furthermore, one or more of the first embedded contact openings 11 can be patterned and etched so that, following processes 222-224, they abut and particularly intersect the first wire trench 21.

Figure 9A:
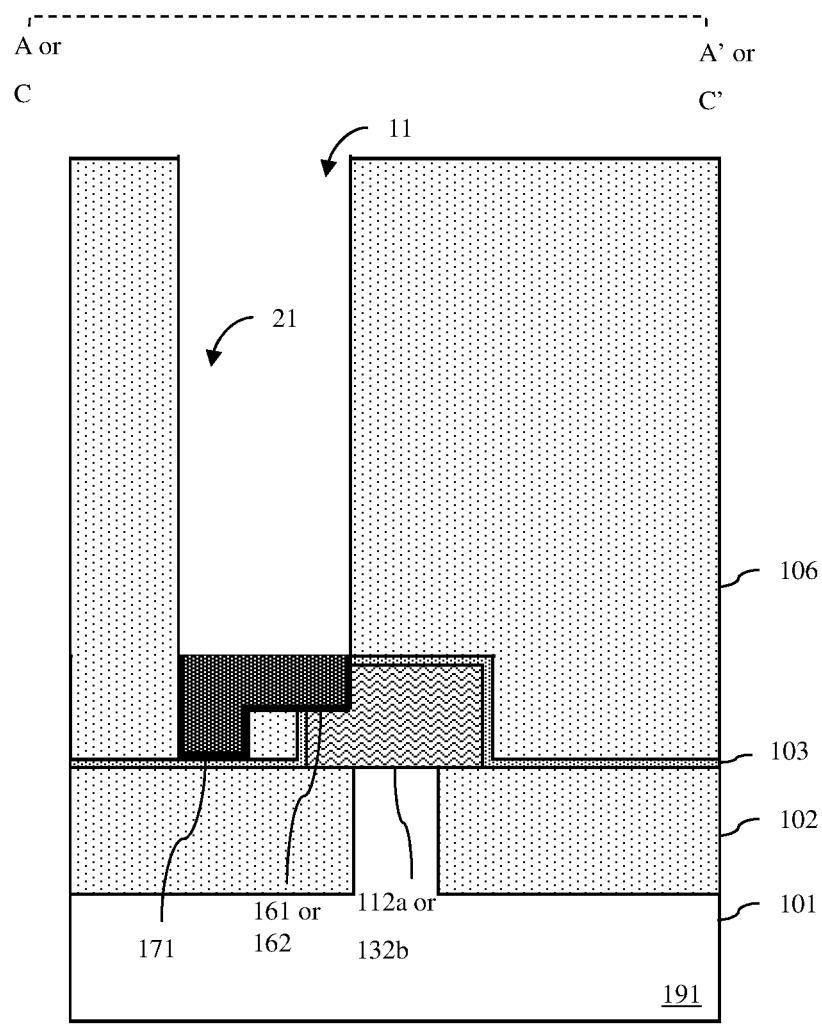
FIGS. 9A-9B are cross-section diagrams of a partially completed IC structure formed according to the flow diagram of FIGS. 2A-2B.
Figure 9B:
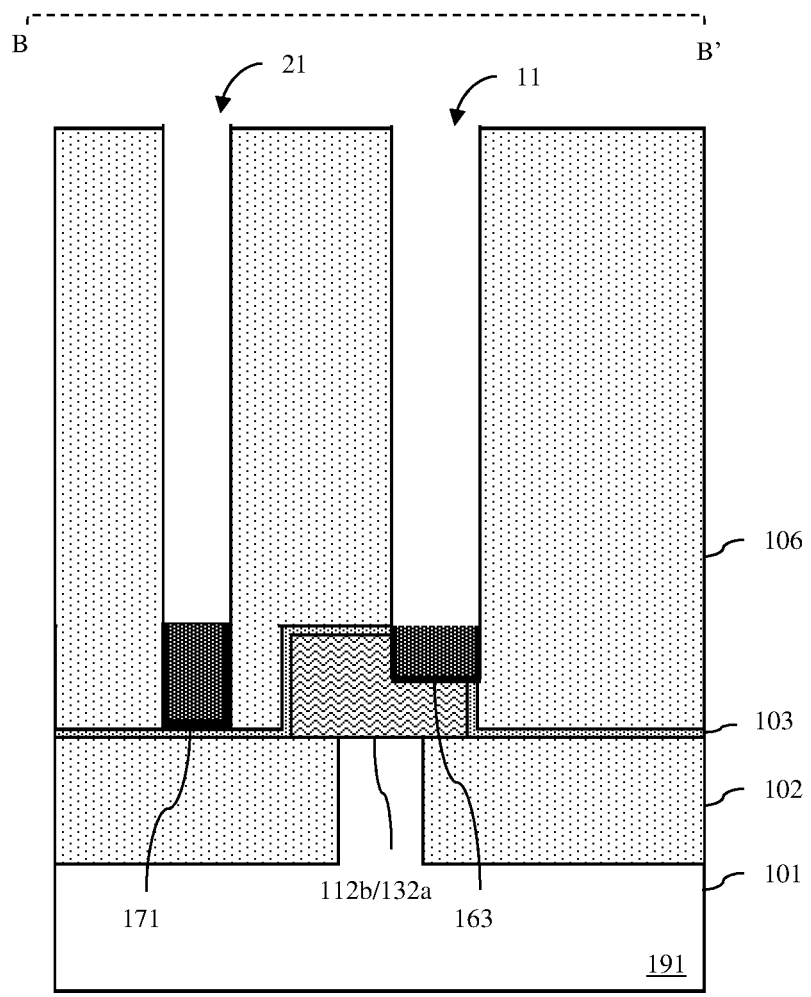

One or more metallization processes can be performed to fill the first wire trench 21 and the first embedded contact openings 11 with metal conductors (see process 226 and FIGS. 9A-9B). For example, metallization processes can be performed following each of the patterning and etch processes in order to first fill the first wire trench 21 with a metal conductor and then subsequently fill the first embedded contact openings 11 with metal conductors or vice versa. Alternatively, back-to-back patterning and etch processes can be performed and a single metallization process can be performed in order to simultaneously fill the first wire trench 21 and the first embedded contact openings 11 with metal conductors. In any case, the metal conductor can include, for example, optional conformal adhesion and/or diffusion barrier layers and one or more layers of metal and/or metal alloy materials (e.g., tungsten, cobalt, nickel, aluminum, copper, or any other suitable conductor material). Following metallization, the metal material can be recessed so that the top surface of the metal conductor (i.e., the first buried wire 171) within the first wire trench 21 and the top surfaces of the metal conductors (i.e., the first embedded contacts 161-163) in the first embedded contact openings 11 are at or below the level of the portion of the conformal dielectric layer 103 on the top of the first source/drain regions. It should be understood that if a single metallization process is performed, the first buried wire 171 and any first embedded contacts (e.g., 161 and 162) that abut this first buried wire 171 will be different portions of a single contiguous metal feature and, thus, will exhibit reduced resistance.

A blanket dielectric layer of the second dielectric material 106 (e.g., silicon dioxide) can again be deposited over the partially completed structure and, particularly, over the first buried wire 171 and the first embedded contacts 161-162, re-filling the first wire trench 21 and the first embedded contact openings 11, respectively (see process 228). Optionally, a polishing process (e.g., a CMP process) can be performed to again expose the tops of the sacrificial gate caps 154. Also, optionally, the second dielectric material 106 can be recessed to some level below the tops of the sacrificial gate caps 154 and above the desired height for the second source/drain regions of second GAAFETs, which will subsequently be formed above the first source/drain regions.

Figure 10:
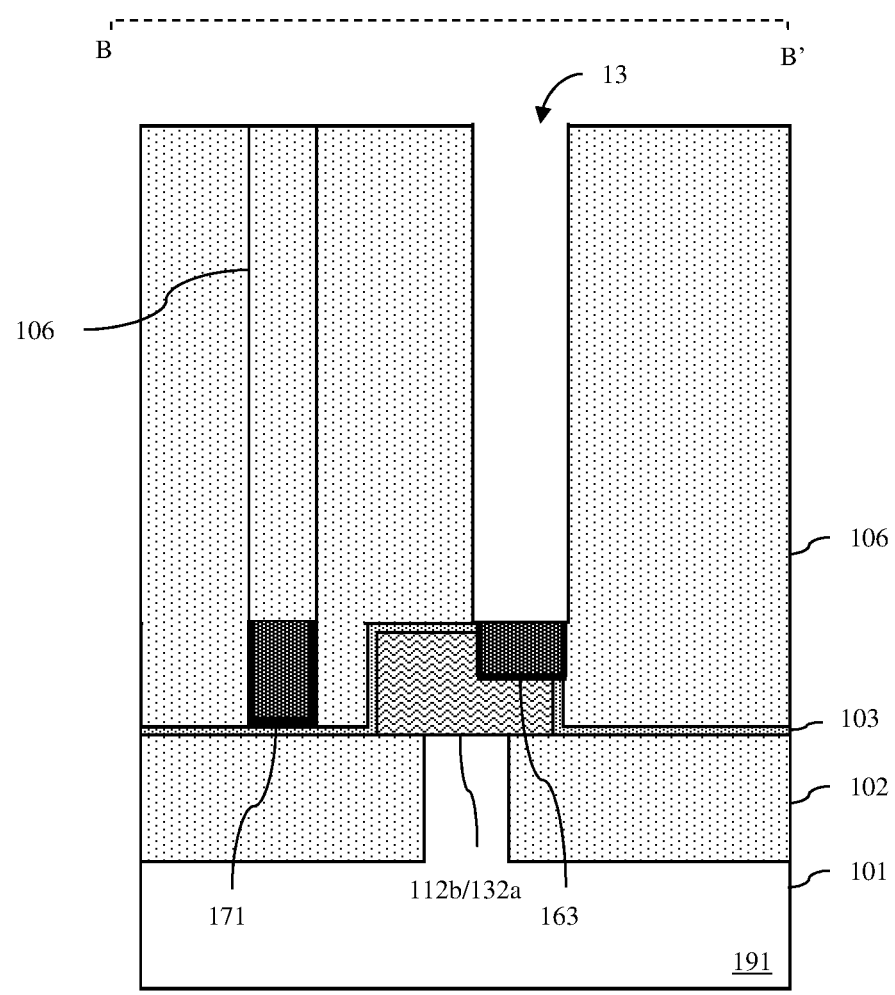
FIG. 10 is a cross-section diagram of a partially completed IC structure formed according to the flow diagram of FIGS. 2A-2B.

Next, additional patterning and etch steps can be performed in order to form at least one additional contact opening 13 for an insulated contact to at least one first embedded contact, which was previously formed in a first source/drain region and which was not connected to the first buried wire 171 (see process 230 and FIG. 10). For example, see the contact opening 13 to the first embedded contact 163, which was previously formed on the shared first source/drain region 112b/132a and which is not connected to the first buried wire 171.

Figure 11:
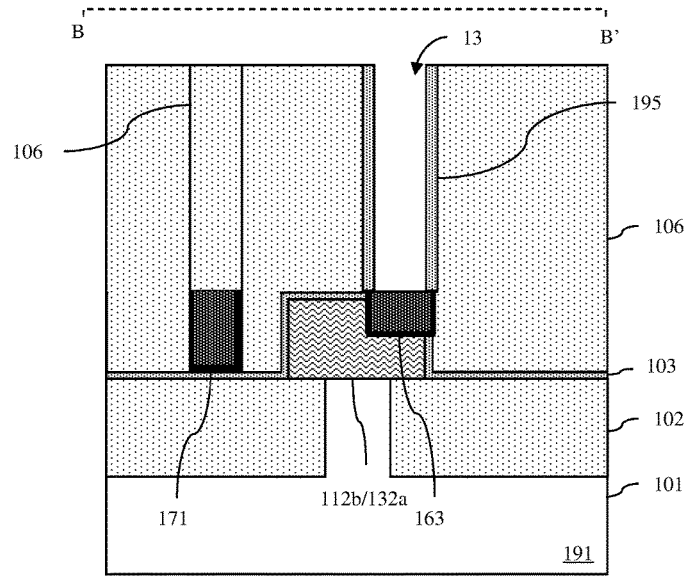
FIG. 11 is a cross-section diagram of a partially completed IC structure formed according to the flow diagram of FIGS. 2A-2B.
Figure 12:
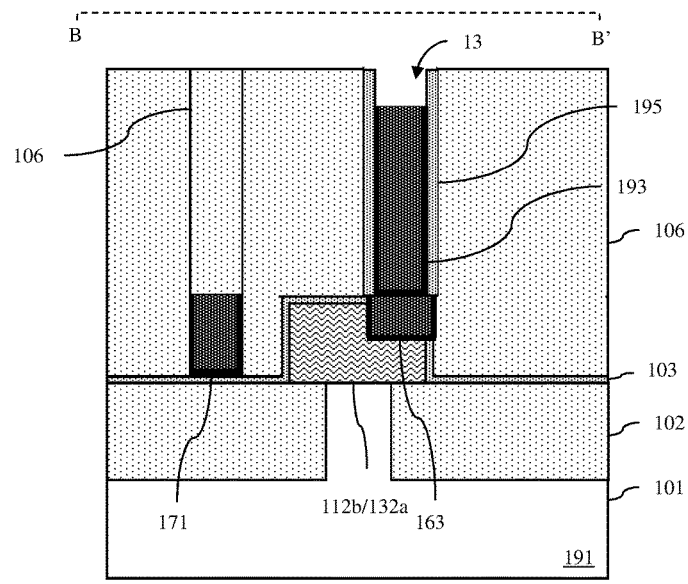
FIG. 12 is a cross-section diagram of a partially completed IC structure formed according to the flow diagram of FIGS. 2A-2B.

An insulated contact 193 can then be formed within this additional contact opening 13 (see process 232 and FIGS. 11-12). Specifically, dielectric sidewall spacers 195 (e.g., silicon nitride sidewall spacers) can be formed on the sidewalls of the additional contact opening 13 (e.g., using conventional sidewall spacer formation techniques). Next, a metallization process can be performed in order to fill the additional contact opening 13 with a metal conductor. The metal conductor can include, for example, optional conformal adhesion and/or diffusion barrier layers and one or more layers of metal and/or metal alloy materials (e.g., tungsten, cobalt, nickel, aluminum, copper, or any other suitable conductor material). Following the metallization process, the metal material can, optionally, be recessed so that the top of the metal conductor of the insulated contact 193 is below the level of the tops of the dielectric sidewall spacers 195.

Next, the second dielectric material 106 can be selectively recessed (i.e., etched back) so that the top of the second dielectric material 106 is approximately level with the top of the first source/drain regions 112a-112b, 132a-132b and, particularly, below the level of the bottom surface of any layer of the first semiconductor material 191 that is to be incorporated into the second GAAFETs as a second channel region (see process 236). Then, another thin conformal dielectric layer 104 of the first dielectric material (e.g., silicon nitride) can be deposited over the partially completed structure (see process 238 and FIGS. 13A-13B). This conformal dielectric layer 104 can be deposited with a horizontal bias (i.e., so that horizontal portions of the layer will be relatively thick as compared to vertical portions).

Figure 14A:
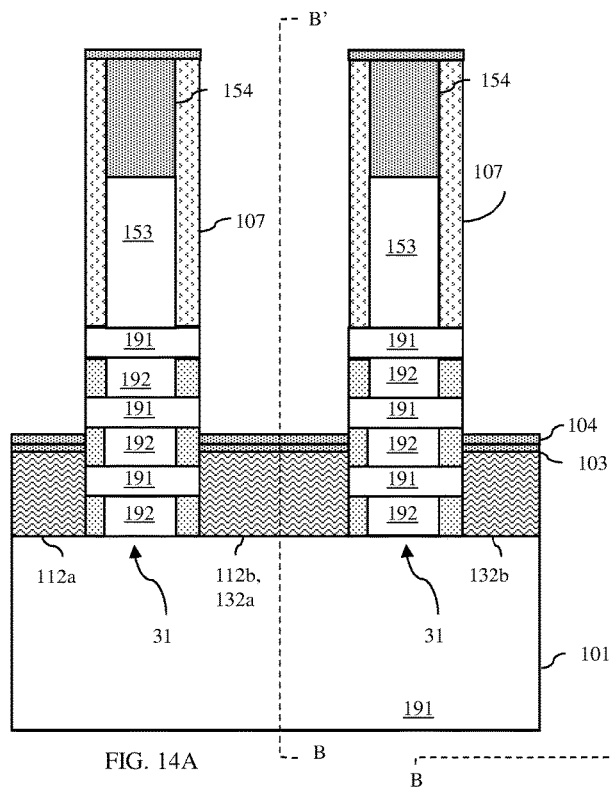
FIGS. 14A-14B are cross-section diagrams of a partially completed IC structure formed according to the flow diagram of FIGS. 2A-2B.
Figure 14B:
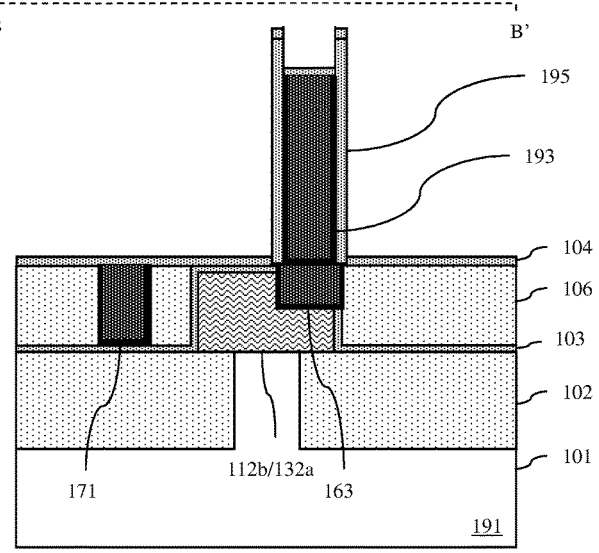
Figure 15A:
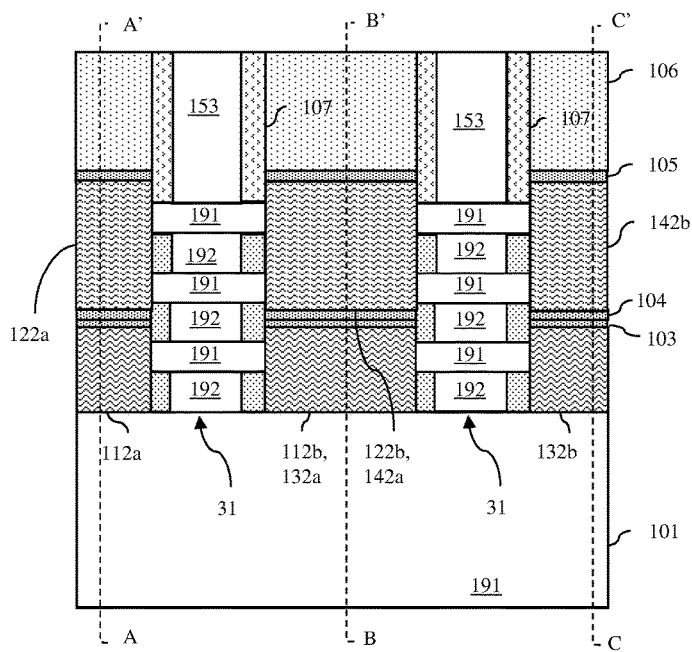
FIGS. 15A-15D are cross-section diagrams of a partially completed IC structure formed according to the flow diagram of FIGS. 2A-2B.
Figure 15B:
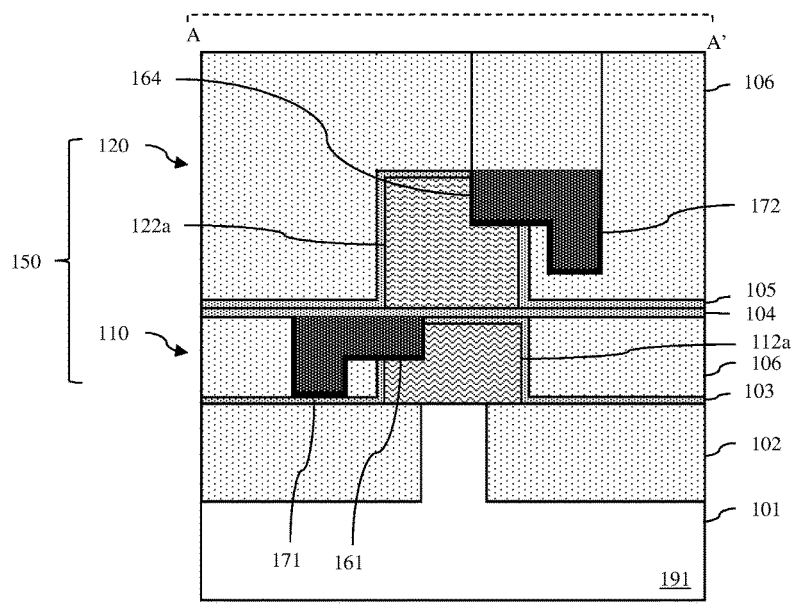
Figure 15C:
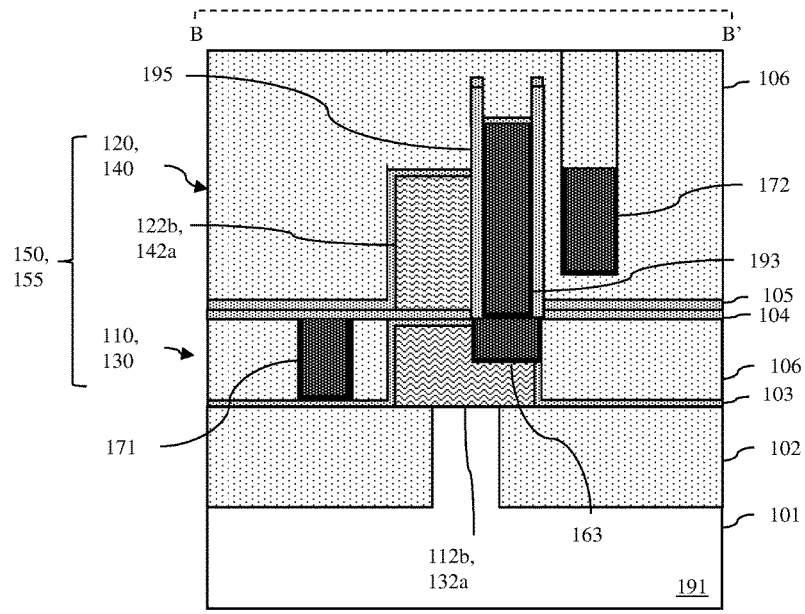
Figure 15D:
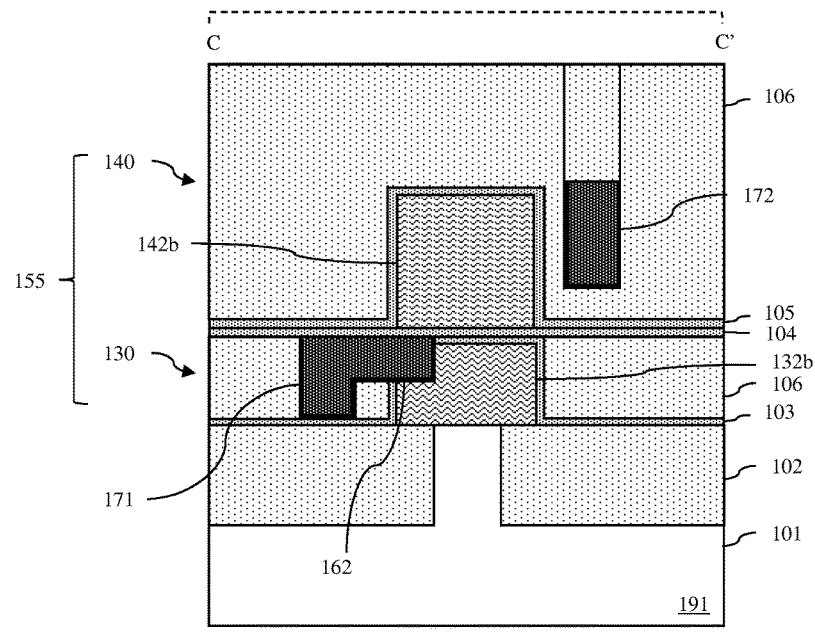

After deposition of the conformal dielectric layer 104, an isotropic etch process can be performed so as to remove exposed relatively thin vertical portions of the first dielectric material (i.e., of the conformal dielectric layers 103 and 104) (see process 240 and FIGS. 14A-14B). This isotropic etch process can specifically be used to expose, on opposing sides of the sacrificial gates 153, vertical surfaces of at least one upper layer of the first semiconductor material 191 in the remaining first portions 31 of the multi-layer fin 190. Since the conformal dielectric layers 103 and 104 of the first dielectric material were previously deposited with a horizontal bias (i.e., such that the horizontal portions were thicker than the vertical portions), this isotropic etch process can be stopped prior to complete removal of the horizontal portions of the first dielectric material and, particularly, prior to exposure of the first source/drain regions 112a-b, 132a-b below. It should be noted that the dielectric sidewall spacers 195 of the insulated contact 193 should be formed such that they are sufficiently thick to also survive this isotropic etch process.

Referring to FIGS. 15A-15D, once the vertical surfaces of the upper layer(s) of the first semiconductor material 191 on the remaining first portions 31 of the multi-layer fin 190 are exposed, second source/drain regions 122a-122b, 142a-142b for second GAAFETs (i.e., for upper GAAFETs) can be formed (see process 242). Specifically, the second GAAFETs can have a second-type conductivity that is different from the first-type conductivity of the first GAAFETs (e.g., the second GAAFETs can be N-type GAAFETs). The second source/drain regions 122a-122b, 142a-142b can be formed by epitaxial deposition of an in situ-doped semiconductor material on the exposed vertical surfaces of the first semiconductor material 191. Thus, the second source/drain regions 122a-122b, 142a-142b will be on opposing sides of the sacrificial gates 153, above and electrically isolated from the first source/drain regions 112a-b, 132a-b by the dielectric layers 103 and 104.

It should be noted that, for purposes of illustration, the method is described above such that the FETs in a given stacked pair of FETs are formed with different type conductivities. For example, a given stacked pair of FETs could be formed so as to include an N-type FET on a P-type FET or vice versa. However, it should be understood that, alternatively, a given stacked pair of FETs could be formed so as to include FETs having the same type conductivity (e.g., an N-type FET on another N-type FET or a P-type FET on another P-type FET).

Following formation of the second source/drain regions, a thin dielectric layer 105 of the first dielectric material (e.g., silicon nitride) can be deposited to cover the second source/drain regions and a blanket dielectric layer of the second dielectric material 106 (e.g., silicon dioxide) can be deposited on the layer 105. Subsequently, a polishing process (e.g., a CMP process) can be performed to expose the tops of the sacrificial gate caps 154 (see process 244).

Multiple lithographic patterning and etch processes (similar to those described above at processes 222-224) can then performed in order to form, in the second dielectric material 106 adjacent to the second source/drain regions, a second wire trench for a second buried wire and second embedded contact opening(s) for second embedded contact(s) in one or more of the second source/drain regions 122a-122b, 142a-142b (see processes 246-248). The second wire trench can be patterned and etched such that it has a lower portion in the second dielectric material 106 positioned laterally adjacent to and at the same level as the second source/drain regions 122*a*-122*b*, 142*a*-142*b* on a second side of the partially completed structure. Second embedded contact opening(s) can be patterned and etched such that each second embedded contact opening extends vertically through the second dielectric material 106 into a corresponding second source/drain region (e.g., such that a bottom surface of the second embedded contact opening is at least some distance below the top surface of that second source/drain region). Furthermore, at least one second embedded contact opening can be patterned and etched so as to extend laterally beyond a side edge of the second source/drain region so that, following processes 246-248, the second embedded contact opening abuts and particularly intersects a second wire trench.

One or more metallization processes can be performed to fill the second wire trench and the second embedded contact opening(s) with metal conductors (see process 250). For example, metallization processes can be performed following each of the patterning and etch processes in order to first fill the second wire trench with a metal conductor and then fill the second embedded contact opening(s) with metal conductor(s) or vice versa. Alternatively, back-to-back patterning and etch processes can be performed and a single metallization process can be performed in order to simultaneously fill the second wire trench and the second embedded contact opening(s) with metal conductor(s). In any case, the metal conductor can include, for example, optional adhesion and/or diffusion barrier layers and one or more layers of metal and/or metal alloy materials (e.g., tungsten, cobalt, nickel, aluminum, copper, or any other suitable conductor material). Following metallization, the metal material can be recessed, for example, so that the top surface of the metal conductor (i.e., the second buried wire 172) within the second wire trench and the top surface of the metal conductor (i.e., the second embedded contact 164) in each second embedded contact openings are at or below the level of the portion of the conformal dielectric layer 105 on the top of the second source/drain regions. It should be understood that if a single metallization process is performed, the second buried wire 172 and any second embedded contact 164 that abuts this second buried wire 172 will be different portions of a single contiguous metal feature and, thus, will exhibit reduced resistance.

A blanket dielectric layer of the second dielectric material 106 can be deposited over the partially completed structure and, particularly, over the second buried wire and the second embedded contact(s) re-fill the second wire trench and second embedded contact opening(s) (see process 252). Then, a polishing process (e.g., a CMP process) can be performed in order to remove the sacrificial gate caps 154 and expose the tops of the sacrificial gates 153.

Figure 16A:
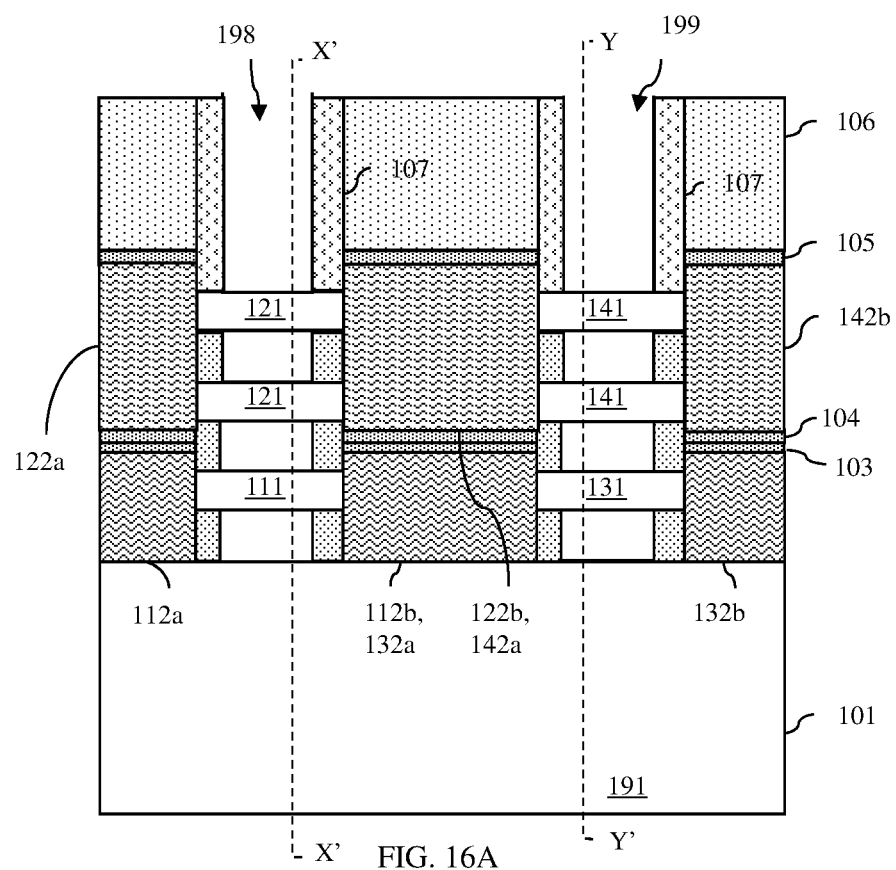
FIGS. 16A-16C are cross-section diagrams of a partially completed IC structure formed according to the flow diagram of FIGS. 2A-2B.
Figure 16B:
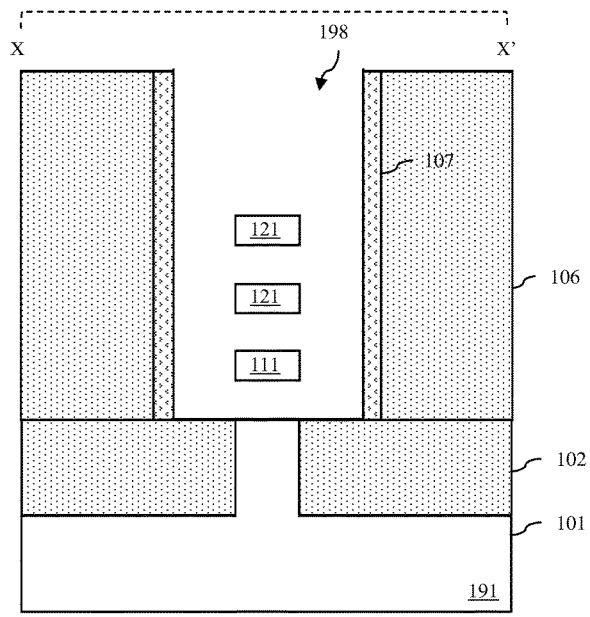
Figure 16C:
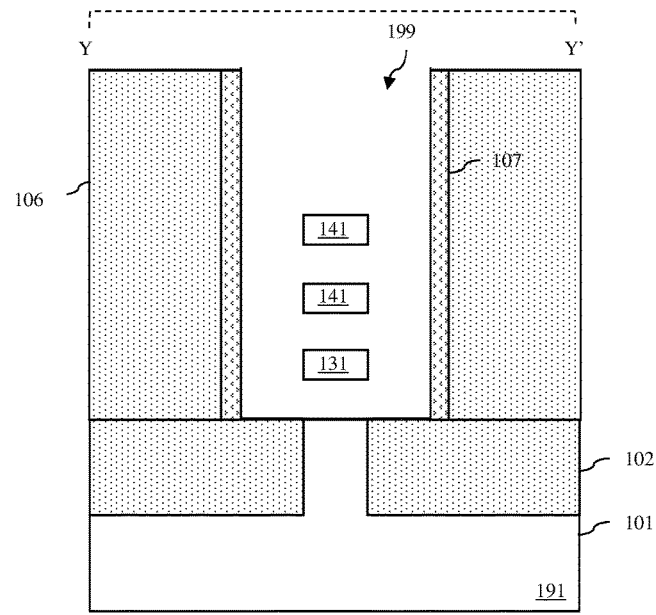

Referring to FIGS. 16A-16C, the sacrificial gates 153 can then be selectively removed, thereby creating first portions of gate openings 198-199, respectively (see process 254). That is, a selective etch process can be performed to selectively etch away the material of the sacrificial gate layer over the materials of the multi-layer fin (i.e., over the first semiconductor material 191 and the second semiconductor material 192) and also over the adjacent dielectric materials of the gate sidewall spacers 107 and blanket dielectric layer, thereby creating first portions of gate openings that expose the remaining portions of the multi-layer fin. As mentioned above, formation of the sacrificial gates 153 typically includes deposition of a thin conformal silicon dioxide layer prior to deposition and patterning of the sacrificial gate material. This thin conformal silicon dioxide layer will protect the semiconductor material of the multi-layer fin during removal of the sacrificial gates. Following removal of the sacrificial gates 153, this silicon dioxide layer can also be removed from the gate openings (e.g., by buffered hydrofluoric acid (BHF)).

Once the first portions of gate openings are formed, the second semiconductor material 192 exposed within the first portions of the gate openings can be selectively etched away to form second portions of gate openings 198-199, respectively (see process 256). For example, if the first semiconductor material 191 is silicon and the second semiconductor material 192 is silicon germanium, the silicon germanium can be selectively etched over the silicon and adjacent dielectric materials using any of the following exemplary processes: a thermal etch process (e.g., using gaseous hydrochloric acid (HCl)), a dry plasma etch process, or a wet etch process with process specifications designed to ensure the selective etch of silicon germanium over silicon and various dielectric materials. Alternatively, any other suitable isotropic selective etch process that selectively etches silicon germanium could be used. As a result of process 256 (i.e., as a result of forming the second portions of the gate openings), at least one discrete elongated nanoshape of the first semiconductor material 191 will extend laterally between the first sources/drain regions 112*a*-112*b*, 132*a*-132*b* in each gate opening 198, 199, thereby forming first channel region(s) 111, 131 of first FET(s) 110, 130. Furthermore, at least one discrete elongated nanoshape of the first semiconductor material 191 will extend laterally between the second source/drain regions 122*a*-122*b*, 142*a*-142*b* in each gate opening 198, 199, thereby forming second channel region(s) 121, 141 of second FET(s) 120, 140.

Referring to FIGS. 1A-1D, shared gates 151, 156 can then be formed in the gate openings 198, 199 (see process 258). Specifically, the shared gate 151 can be formed in the gate opening 198 adjacent to the first channel region(s) 111 and the second channel region(s) 121. Furthermore, the shared gate 156 can be formed in the gate opening 199 adjacent to the first channel region(s) 131 and the second channel region(s) 141. The shared gates 151, 156 can be formed using replacement metal gate (RMG) formation techniques. In one exemplary embodiment, the shared gates 151, 156 can be formed as single work function RMGs. In another exemplary embodiment, as described below, the shared gates 151, 156 can be formed so as dual work function RMGs.

For example, the shared dual work function RMGs can each have a lower section (l) and an upper section (u) above the lower section. The lower section (l) can be on the substrate and can wrap around the first channel region(s) (i.e. can be above, below and on the opposing sides of the first channel region(s)). The upper section (u) can be above the lower section (l) and can wrap around the second channel region(s) (i.e. can be above, below and on the opposing sides of the second channel region(s)). Furthermore, the lower section (l) can have a first work function optimal for performance of a GAAFET with a first-type conductivity (e.g., for a P-type GAAFET) and the upper section (u) can have a second work function optimal for performance of a GAAFET with a second-type conductivity (e.g., for an N-type GAAFET).

To form such shared dual work function RMGs 151, 156, a conformal gate dielectric layer (e.g., a conformal high-K gate dielectric layer) can be deposited so that it is immediately adjacent to and wraps around the first channel region(s) and the second channel region(s). A conformal first work function metal layer can then be deposited, followed by deposition of a conductive fill material. These metals can be recessed to expose the second channel region(s) in each gate opening. Then, a conformal second work function metal layer, which is different from the first work function metal layer, can be deposited, followed again by deposition of the conductive fill material. These metals can then be recessed without exposing the second channel region(s) in each opening, thereby forming the shared RMGs 151, 156. Next, a dielectric gate cap material (e.g., silicon nitride) can be deposited and a polishing process (e.g., a CMP process) can be performed in order to remove any of the dielectric gate cap material from above the second dielectric material 106, thereby forming the dielectric gate caps 157 on the shared RMGs 151, 156 (see process 260).

Conventional middle of the line (MOL) and back end of the line (BEOL) processing can then be performed in order to complete the IC structure 100 (see process 262). MOL processing can include, for example: the formation of MOL contacts 185, 186 to the shared RMGs 151, 156; the formation of MOL contacts 194 to second source/drain regions, as necessary; and, depending upon the height of any insulated contact 193, the formation of MOL contacts 199 to insulated contacts 193. BEOL processing can include, but is not limited to, the formation of the various metal level wires 181-183, as discussed above with regard to the structure embodiments.

It should be understood the method described above and illustrated in the figures is not intended to be limiting. Different techniques could alternatively be used to form the IC structure shown in FIGS. 1A-1E. Furthermore, different embodiments of the disclosed method could include the formation of one or more stacked pairs of different types of FETs (e.g., any other FETs suitable for stacking) and could further include the formation of different combinations of the above-mentioned metal components. For example, different embodiments of the method could include the formation of embedded contacts in first source/drain regions connected to metal level wires through insulated contacts, but not the formation of a first buried wire and embedded contacts connected thereto, or vice versa.

In the above-described structure and method embodiments the first FETs 110, 130 are described as having the first-type conductivity (e.g., as being P-type) and the second FETs 120, 140 are described as having the second-type conductivity (e.g., as being N-type FET). For a P-type FET, the channel region(s) can have N-type conductivity at a relatively low conductivity level (or can be undoped) and the source/drain regions can have P-type conductivity at a relatively high conductivity level; whereas, for an N-type FET, the channel region(s) can have P-type conductivity at a relatively low conductivity level (or can be undoped) and the source/drain regions can have N-type conductivity and a relatively high conductivity level. Those skilled in the art will recognize that different dopants can be used to achieve the different conductivity types and that the dopants may vary depending upon the different semiconductor materials used. For example, a silicon-based semiconductor material (e.g., silicon, silicon germanium, etc.) having P-type conductivity is typically doped with a P-type dopant (e.g., a Group III dopant, such as boron (B) or indium (In)), whereas a silicon-based semiconductor material having N-type conductivity is typically doped with an N-type dopant (e.g., a Group V dopant, such as arsenic (As), phosphorous (P) or antimony (Sb)). Alternatively, a gallium nitride (GaN)-based semiconductor material having P-type conductivity is typically doped with magnesium (Mg), whereas a gallium nitride (GaN)-based semiconductor material having N-type conductivity is typically doped with silicon (Si). Those skilled in the art will also recognize that different conductivity levels will depend upon the relative concentration levels of the dopants.

Additionally, in the above-described structure and method embodiments the shared gates 151, 156 are described as, optionally, being shared dual work function RMGs with a lower section (l) having a first work function and an upper section (u) having a second work function. In these dual work function RMGs, the gate dielectric layer can be a high-K gate dielectric layer. The high-K gate dielectric layer can be, for example, a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The different work function metals of the lower and upper section can be preselected in order to achieve the optimal gate conductor work function given the conductivity type of the FET. For example, the optimal gate conductor work function for the P-type FETs can be, for example, between about 4.9 eV and about 5.2 eV. Exemplary metals (and metal alloys) having a work function within or close to this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function for N-type FETs can be, for example, between 3.9 eV and about 4.2 eV. Exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. Any conductive fill material used can be a fill metal or fill metal alloy, such as tungsten, a tungsten alloy (e.g., tungsten silicide or titanium tungsten), cobalt, aluminum or any other suitable fill metal or fill metal alloy.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "second", "first", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit structure comprising:
   a first transistor on a substrate and comprising two first source/drain regions and at least one first channel region positioned laterally between the two first source/drain regions;
   a dielectric layer on the first source/drain regions;
   a second transistor above the first transistor such that the first transistor is stacked between the substrate and the second transistor, the second transistor comprising two second source/drain regions and at least one second channel region positioned laterally between the second source/drain regions, the two second source/drain regions and the at least one second channel region being aligned with the two first source/drain regions and the at least one first channel region, respectively, and the two second source/drain regions being electrically isolated from the two first source/drain regions by the dielectric layer;
   a first embedded contact in a first source/drain region of the two first source/drain regions of the first transistor; and
   a wire electrically connected to the first embedded contact, wherein the wire is either below the dielectric layer and positioned laterally adjacent to the first source/drain region or in a metal level and aligned above a second source/drain region of the two second source/drain regions of the second transistor.

2. The integrated circuit structure of claim 1, the first transistor and the second transistor having a shared gate adjacent to the at least one first channel region and the at least one second channel region.

3. The integrated circuit structure of claim 1, the wire being one of a power wire and a signal wire.

4. The integrated circuit structure of claim 1, the wire being a buried wire positioned laterally adjacent to the first source/drain region and the first embedded contact extending laterally beyond a side edge of the first source/drain region and contacting the buried wire.

5. The integrated circuit structure of claim 4, the buried wire and the first embedded contact comprising different portions of a single contiguous metal feature.

6. The integrated circuit structure of claim 1,
   the wire being a metal level wire,
   the integrated circuit structure further comprising an insulated contact extending vertically from the first embedded contact through the second source/drain region, and
   the insulated contact being electrically connected to the metal level wire and being electrically isolated from the second source/drain region.

7. The integrated circuit structure of claim 6, further comprising an additional contact extending vertically between the insulated contact and the metal level wire.

8. An integrated circuit structure comprising:
   a stacked pair of transistors on a substrate and comprising:
      a first transistor on the substrate and comprising two first source/drain regions and at least one first channel region positioned laterally between the two first source/drain regions;
      a second transistor stacked above the first transistor and comprising two second source/drain regions and at least one second channel region positioned laterally between the two second source/drain regions, the two second source/drain regions and the at least one second channel region being aligned above the two first source/drain regions and the at least one first channel region, respectively; and
      at least one dielectric layer between the two first source/drain regions and the two second source/drain regions;
   a first buried wire below the dielectric layer and positioned laterally adjacent to a first source/drain region of the two first source/drain regions of the first transistor on a first side of the stacked pair;
   a second buried wire above the dielectric layer and positioned laterally adjacent to a second source/drain region of the two second source/drain regions of the second transistor on a second side of the stacked pair opposite the first side;
   a first embedded contact in the first source/drain region, having a top surface covered by the dielectric layer, and extending laterally beyond a side edge of the first source/drain region to the first buried wire; and,
   a second embedded contact in the second source/drain region and extending laterally beyond a side edge of the second source/drain region to the second buried wire.

9. The integrated circuit structure of claim 8, the first transistor and the second transistor having a shared gate adjacent to the at least one first channel region and the at least one second channel region.

10. The integrated circuit structure of claim 8, the first buried wire and the second buried wire each being one of a power wire and a signal wire.

11. The integrated circuit structure of claim 8, further comprising:
    a first buried wire trench in dielectric material positioned laterally adjacent to the first source/drain region;
    a first embedded contact opening extending from the first buried wire trench through the dielectric material and into the first source/drain region;
    a single contiguous first metal feature in the first buried wire trench and the first embedded, wherein the first buried wire and the first embedded contact comprise different portions of the single contiguous first metal feature;
    a second buried wire trench in additional dielectric material positioned laterally adjacent to the second source/drain region;

a second embedded contact opening extending from the second buried wire trench through the additional dielectric material and into the second source/drain region; and a single contiguous second metal feature in the second buried wire trench and the second embedded, wherein the second buried wire and the second embedded contact comprise different portions of the single contiguous second metal feature.

12. The integrated circuit structure of claim 8, further comprising:
a metal level wire in a metal level above the second transistor and on the second side of the stacked pair; and an additional first embedded contact in a different one of the two first source/drain regions of the first transistor and electrically connected to the metal level wire.

13. The integrated circuit structure of claim 12, further comprising an insulated contact extending vertically from the additional first embedded contact through the second transistor, the insulated contact being electrically connected to the metal level wire and electrically isolated from the second transistor.

14. The integrated circuit structure of claim 13, further comprising an additional contact extending vertically between the insulated contact and the metal level wire.

15. An integrated circuit structure comprising:
a stacked pair of transistors on a substrate and comprising:
a first transistor on the substrate and comprising two first source/drain regions and at least one first channel region positioned laterally between the two first source/drain regions;
a second transistor stacked above the first transistor and comprising two second source/drain regions and at least one second channel region positioned laterally between the two second source/drain regions, the two second source/drain regions and the at least one second channel region being aligned above the two first source/drain regions and the at least one first channel region, respectively; and at least one dielectric layer between the two first source/drain regions and the two second source/drain regions;
a buried wire below the dielectric layer and positioned laterally adjacent to a first source/drain region of the two first source/drain regions of the first transistor on a first side of the stacked pair;
a metal level wire in a metal level above the second transistor and on a second side of the stacked pair opposite the first side; and,
two first embedded contacts in the two first source/drain regions and electrically connected to the buried wire and the metal level wire, respectively.

16. The integrated circuit structure of claim 15, the first transistor and the second transistor having a shared gate adjacent to the at least one first channel region and the at least one second channel region.

17. The integrated circuit structure of claim 15, the buried wire and the metal level wire each being one of a power wire and a signal wire.

18. The integrated circuit structure of claim 15, further comprising an insulated contact extending vertically from one of the two first embedded contacts through one of the two second source/drain regions of the second transistor, the insulated contact being electrically connected to the metal level wire and electrically isolated from the second source/drain region.

19. The integrated circuit structure of claim 18, further comprising an additional contact extending vertically between the insulated contact and the metal level wire.

20. The integrated circuit structure of claim 15, further comprising:
a second buried wire positioned laterally adjacent to a second source/drain region of the two second source/drain regions of the second transistor on the second side of the stacked pair; and,
a second embedded contact in the second source/drain region and extending laterally beyond a side edge of the second source/drain region to the second buried wire.

* * * * *